US012690364B2

(12) United States Patent
Kang et al.

(10) Patent No.: US 12,690,364 B2
(45) Date of Patent: Jul. 21, 2026

(54) DISPLAY DEVICE AND METHOD OF MANUFACTURING THE SAME

(71) Applicant: Samsung Display Co., Ltd., Yongin-si (KR)

(72) Inventors: Kinyeng Kang, Yongin-si (KR); Guanghai Jin, Yongin-si (KR); Sunkwang Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 429 days.

(21) Appl. No.: 18/185,250

(22) Filed: Mar. 16, 2023

(65) Prior Publication Data

US 2024/0016034 A1     Jan. 11, 2024

(30) Foreign Application Priority Data

Jul. 6, 2022     (KR) ........................ 10-2022-0083157

(51) Int. Cl.
*H10K 59/80*     (2023.01)
*H10K 59/12*     (2023.01)
*H10K 59/122*     (2023.01)
*H10K 59/35*     (2023.01)

(52) U.S. Cl.
CPC ... *H10K 59/80522* (2023.02); *H10K 59/1201* (2023.02); *H10K 59/122* (2023.02); *H10K 59/352* (2023.02); *H10K 59/353* (2023.02)

(58) Field of Classification Search
None
See application file for complete search history.

(56) References Cited

U.S. PATENT DOCUMENTS

| | | | |
|---|---|---|---|
| 9,024,307 | B2 | 5/2015 | Lee |
| 9,595,575 | B2 | 3/2017 | Cho et al. |
| 9,710,090 | B2 | 7/2017 | Choi |
| 2005/0236629 | A1 | 10/2005 | Lee et al. |

(Continued)

FOREIGN PATENT DOCUMENTS

| | | |
|---|---|---|
| KR | 10-2005-0098596 A | 10/2005 |
| KR | 10-2011-0138787 A | 12/2011 |

(Continued)

*Primary Examiner* — Sarah K Salerno
(74) *Attorney, Agent, or Firm* — Womble Bond Dickinson (US) LLP

(57)     ABSTRACT

A display apparatus includes: a substrate including: pixel areas corresponding to sub-pixels, respectively, the sub-pixels including first, second, and third sub-pixels; and non-display areas surrounding the pixel areas, respectively; a first electrode on the substrate; an auxiliary electrode on the substrate, and extending to cross a non-display area between the second sub-pixel and the first sub-pixel, and a non-display area between the second sub-pixel and the third sub-pixel; a bank layer having a first bank opening overlapping with the first electrode, and a second bank opening overlapping with the auxiliary electrode; an intermediate layer on the first electrode and the auxiliary electrode, and having a first opening exposing a portion of the auxiliary electrode, and overlapping with a pattern including the auxiliary electrode; and a second electrode on the intermediate layer to overlap with the first electrode and the auxiliary electrode, and contacting the auxiliary electrode through the first opening.

20 Claims, 29 Drawing Sheets

(56) References Cited

U.S. PATENT DOCUMENTS

| | | | |
|---|---|---|---|
| 2017/0256597 A1* | 9/2017 | Lee | ..................... H10K 59/873 |
| 2018/0158878 A1 | 6/2018 | Lee et al. | |
| 2020/0176709 A1 | 6/2020 | Moon et al. | |
| 2021/0111232 A1 | 4/2021 | Park et al. | |

FOREIGN PATENT DOCUMENTS

| | | | |
|---|---|---|---|
| KR | 10-1683153 | B1 | 12/2016 |
| KR | 10-2017-0104085 | A | 9/2017 |
| KR | 10-2018-0066320 | A | 6/2018 |
| KR | 10-2020-0066497 | A | 6/2020 |
| KR | 10-2131248 | B1 | 7/2020 |
| KR | 10-2021-0043792 | A | 4/2021 |
| KR | 10-2021-0072544 | A | 6/2021 |
| KR | 10-2295584 | B1 | 8/2021 |
| KR | 10-2356592 | B1 | 1/2022 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2022-0083157, filed on Jul. 6, 2022, in the Korean Intellectual Property Office, the entire disclosure of which is incorporated by reference herein.

BACKGROUND

1. Field

Aspects of embodiments of present disclosure relate to a structure of a display apparatus, and a method of manufacturing the display apparatus.

2. Description of the Related Art

Display apparatuses visually display images. Such display apparatuses may each include a substrate including a display area and a peripheral area. In the display area, scan lines and data lines are insulated from each other, and a plurality of sub-pixels may be included. Also, in the display area, thin-film transistors, and pixel electrodes electrically connected to the thin-film transistors may be included to correspond to the sub-pixels. Also, an opposite electrode commonly included in the sub-pixels may be included in the display area. In the peripheral area, wires, a scan driver, a data driver, a controller, a pad portion, and the like may be included to transmit electrical signals to the display area.

Such display apparatuses have been used in various fields. Accordingly, various designs have been made to improve the quality of the display apparatuses.

The above information disclosed in this Background section is for enhancement of understanding of the background of the present disclosure, and therefore, it may contain information that does not constitute prior art.

SUMMARY

One or more embodiments of the present disclosure are directed to a display apparatus capable of displaying high-quality images by preventing or reducing a voltage drop in an opposite electrode, and a method of manufacturing the display apparatus. However, the aspects and features of the present disclosure are not limited thereto, and the spirit and scope of the present disclosure are not limited thereto.

The above and additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate including: a plurality of pixel areas corresponding to a plurality of sub-pixels, respectively, the plurality of sub-pixels including a first sub-pixel, a second sub-pixel, and a third sub-pixel configured to emit different colors of light from each other; and a plurality of non-display areas surrounding the plurality of pixel areas, respectively; a first electrode on the substrate; an auxiliary electrode on the substrate, and extending to cross a non-display area from among the plurality of non-display areas between the second sub-pixel and the first sub-pixel, and a non-display area from among the plurality of non-display areas between the second sub-pixel and the third sub-pixel; a bank layer having a first bank opening overlapping with the first electrode, and a second bank opening overlapping with the auxiliary electrode; an intermediate layer on the first electrode and the auxiliary electrode, and having a first opening exposing a portion of the auxiliary electrode, and overlapping with a pattern including the auxiliary electrode; and a second electrode on the intermediate layer to overlap with the first electrode and the auxiliary electrode, and contacting the auxiliary electrode through the first opening in the intermediate layer.

In an embodiment, the first sub-pixel and the third sub-pixel may be alternately located along a first row in a first direction, the second sub-pixel may be located along the first direction in a second row parallel to the first row, and the second sub-pixel may be alternately located with each of the first sub-pixel and the third sub-pixel.

In an embodiment, the pattern including the auxiliary electrode may extend in a first direction in a zigzag pattern in a plan view, and the first opening may have a straight line shape in a plan view that extends along the pattern including the auxiliary electrode.

In an embodiment, the pattern including the auxiliary electrode may extend in a first direction in a zigzag pattern in a plan view, and the first opening may have a hole shape exposing a portion of the pattern including the auxiliary electrode.

In an embodiment, the pattern including the auxiliary electrode may extend in a straight line shape in parallel with a diagonal direction in which the first sub-pixel and the second sub-pixel are alternately located in a plan view, and the first opening may have a straight line shape in a plan view extending along the pattern including the auxiliary electrode.

In an embodiment, the pattern including the auxiliary electrode may extend in a straight line shape in parallel with a diagonal direction in which the first sub-pixel and the second sub-pixel are alternately located in a plan view, and the first opening may have a hole shape exposing a portion of the pattern including the auxiliary electrode.

In an embodiment, each of the plurality of sub-pixels may include a thin-film transistor, the first electrode may include a first connection portion extending to include a contact hole region electrically connected to the thin-film transistor, and the first connection portion may extend in a direction parallel with the pattern including the auxiliary electrode.

In an embodiment, the pattern including the auxiliary electrode may extend in a mesh pattern in a plan view.

In an embodiment, each of the plurality of sub-pixels may include a thin-film transistor, the first electrode may include a first connection portion extending to include a contact hole region electrically connected to the thin-film transistor, and the first connection portion may extend in a direction towards a corner portion crossing the auxiliary electrode.

In an embodiment, the plurality of sub-pixels may be located on vertices of a virtual quadrangle having the first opening as a center.

In an embodiment, the auxiliary electrode may include a same material as that of the first electrode.

In an embodiment, each of the plurality of sub-pixels may include a thin-film transistor, and the auxiliary electrode may include a same material as that of a source electrode or a drain electrode of the thin-film transistor.

In an embodiment, the third sub-pixel may include a greater area than those of the first sub-pixel and the second sub-pixel, and open portions of the first sub-pixel, the second sub-pixel, and the third sub-pixel may each be circular in shape.

In an embodiment, the first opening may be located in a non-display area from among the plurality of non-display areas between the first sub-pixel and the second sub-pixel.

In an embodiment, the display apparatus may further include: a second electrode; and a planar portion on the second electrode. The planar portion may include a planar inorganic layer and a planar organic layer, and the planar inorganic layer and the planar organic layer may overlap with the second bank opening and the first opening.

According to one or more embodiments of the present disclosure, a method of manufacturing a display apparatus, includes: forming a first electrode on a substrate, the substrate including: a plurality of pixel areas corresponding to a plurality of sub-pixels, respectively, the plurality of sub-pixels including a first sub-pixel, a second sub-pixel, and a third sub-pixel configured emit different colors of light from each other; and a plurality of non-display areas surrounding the plurality of pixel areas, respectively; forming, on the substrate, an auxiliary electrode extending to cross a non-display area from among the plurality of non-display areas between the second sub-pixel and the first sub-pixel, and a non-display area from among the plurality of non-display areas between the second sub-pixel and the third sub-pixel; forming a bank layer having a first bank opening overlapping with the first electrode, and a second bank opening overlapping with the auxiliary electrode; forming, on the first electrode and the auxiliary electrode, an intermediate layer having a first opening exposing a portion of the auxiliary electrode, and overlapping with a pattern including the auxiliary electrode; and forming a second electrode overlapping with the first electrode and the auxiliary electrode, and contacting the auxiliary electrode through the first opening in the intermediate layer.

In an embodiment, the intermediate layer may be formed after the first bank opening and the second bank opening are formed in the bank layer.

In an embodiment, the first opening in the intermediate later may be formed by irradiating a laser beam onto the intermediate layer to expose a portion of the auxiliary electrode.

In an embodiment, after the bank layer and the intermediate layer are consecutively deposited, the second bank opening and the first opening may be concurrently formed with each other.

In an embodiment, the forming of the second bank opening and the first opening may include irradiating a laser beam onto the bank layer and the intermediate layer to expose a portion of the auxiliary electrode.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
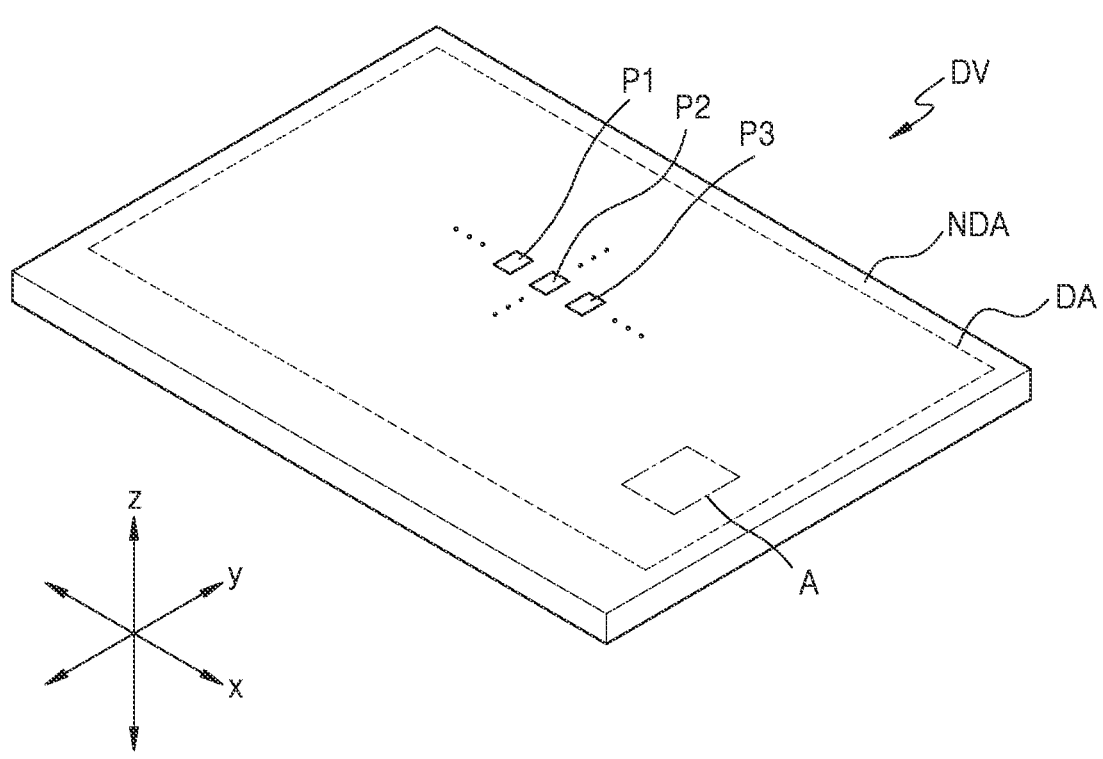
FIG. 1 is a schematic perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus according to an embodiment.

Referring to FIG. 1, a display apparatus DV may include a display area DA, and a non-display area NDA outside the display area DA. The display apparatus DV may provide an image through an array of sub-pixels that are two-dimensionally arranged on an x-y plane at (e.g., in or on) the display area DA. The sub-pixels include a first sub-pixel P1, a second sub-pixel P2, and a third sub-pixel P3, and hereinafter, for convenience, the first sub-pixel P1 is described in more detail in the context of a red sub-pixel, the second sub-pixel P2 is described in more detail in the context of a green sub-pixel, and the third sub-pixel P3 is described in more detail in the context of a blue sub-pixel.

The red sub-pixel, the green sub-pixel, and the blue sub-pixel may be areas where red light, green light, and blue light may be emitted, respectively, and the display apparatus DV may provide an image by using the light emitted from the sub-pixels.

The non-display area NDA may be an area where no images are displayed, and may entirely surround (e.g., around a periphery of) the display area DA. In the non-display area NDA, drivers and/or main voltage lines configured to provide electrical signals or power to pixel circuits may be arranged. In the non-display area NDA, a pad that may be electrically connected to an electronic component or a printed circuit board may be included.

The display area DA may have a polygonal shape including a rectangular shape, as shown in FIG. 1. For example, the display area DA may have a rectangular shape having a horizontal length that is greater than a vertical length, or the horizontal length that is less than the vertical length, or the display area DA may have a square shape. As another example, the display area DA may have various suitable shapes, such as an oval shape or a circular shape.

Figure 2:
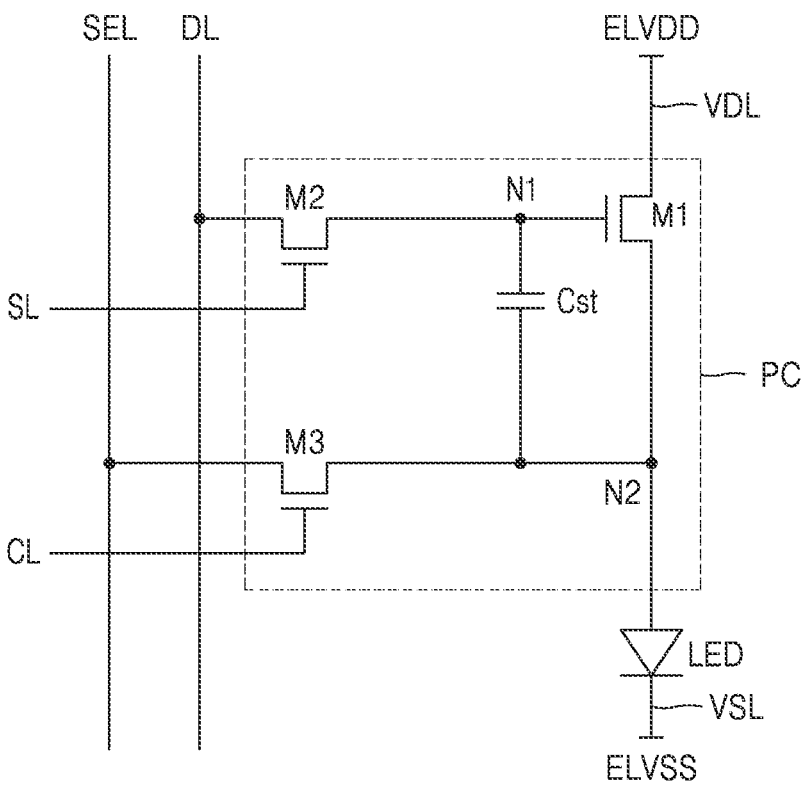
FIG. 2 is an equivalent circuit diagram of a pixel circuit, and a light-emitting diode electrically connected to the pixel circuit, which are included in a display apparatus according to an embodiment.

FIG. 2 is an equivalent circuit diagram of a pixel circuit, and a light-emitting diode electrically connected to the pixel circuit, which are included in a display apparatus according to an embodiment.

Referring to FIG. 2, a first electrode (e.g., an anode) of a light-emitting diode LED may be connected to a pixel circuit PC, and a second electrode (e.g., a cathode) of the light-emitting diode LED may be connected to a common voltage line VSL configured to provide a common power voltage ELVSS. The light-emitting diode LED may emit light having a desired brightness corresponding to an amount of current provided from the pixel circuit PC.

The light-emitting diode LED may include an organic light-emitting diode including an organic material. In another embodiment, the light-emitting diode may be an inorganic light-emitting diode including an inorganic material. The inorganic light-emitting diode may include a PN junction diode including suitable materials based on an inorganic semiconductor. When a voltage is applied to the PN junction diode in a forward direction, electrons and holes may be injected, and energy generated from the recombination of the electrons and holes may be converted into light energy, so that desired colors (e.g., predetermined or certain colors) of light may be emitted. The inorganic light-emitting diode may have a width of several to several hundreds of micrometers, or several to several hundreds of nanometers. In some embodiments, the light-emitting diode LED may be a light-emitting diode including quantum dots. As described above, an emission layer of the light-emitting diode LED may include organic materials, inorganic materials, quantum dots, both organic materials and quantum dots, or both inorganic materials and quantum dots.

The pixel circuit PC may control the amount of current flowing to the common power voltage ELVSS from a driving power voltage ELVDD via the light-emitting diode LED, in response to a data signal. The pixel circuit PC may include a driving transistor M1, a switching transistor M2, a sensing transistor M3, and a storage capacitor Cst.

The driving transistor M1, the switching transistor M2, and the sensing transistor M3 may each be an oxide semiconductor thin-film transistor including a semiconductor layer including an oxide semiconductor, or a silicon semiconductor thin-film transistor including a semiconductor layer including polysilicon. According to a transistor type, a first electrode may be one of a source electrode or a drain electrode, and a second electrode may be the other one thereof.

A first electrode of the driving transistor M1 may be connected to a driving voltage line VDL configured to provide the driving power voltage ELVDD, and a second electrode of the driving transistor M1 may be connected to the first electrode of the light-emitting diode LED. A gate electrode of the driving transistor M1 may be connected to a first node N1. The driving transistor M1 may be configured to control the amount of current flowing in the light-emitting diode LED from the driving power voltage ELVDD, according to a voltage of the first node N1.

The switching transistor M2 may be a switching transistor. A first electrode of the switching transistor M2 may be connected to a data line DL, and a second electrode of the switching transistor M2 may be connected to the first node N1. A gate electrode of the switching transistor M2 may be connected to a scan line SL. The switching transistor M2 may be turned on when a scan signal is provided to the scan line SL, and may electrically connect the data line DL to the first node N1.

The sensing transistor M3 may be an initialization transistor and/or a sensing transistor. A first electrode of the sensing transistor M3 may be connected to a second node N2, and a second electrode of the sensing transistor M3 may be connected to a sensing line SEL. A gate electrode of the sensing transistor M3 may be connected to a control line CL.

The storage capacitor Cst may be connected between the first node N1 and the second node N2. For example, a first capacitor electrode of the storage capacitor Cst may be connected to the gate electrode of the driving transistor M1, and a second capacitor electrode of the storage capacitor Cst may be connected to the first electrode of the light-emitting diode LED.

FIG. 2 shows that the driving transistor M1, the switching transistor M2, and the sensing transistor M3 are each an NMOS transistor, but the present disclosure is not limited thereto. For example, at least one of the driving transistor M1, the switching transistor M2, and the sensing transistor M3 may be a PMOS transistor.

FIG. 2 shows three transistors, but the present disclosure is not limited thereto. For example, the pixel circuit PC may include four or more transistors.

Figure 3:
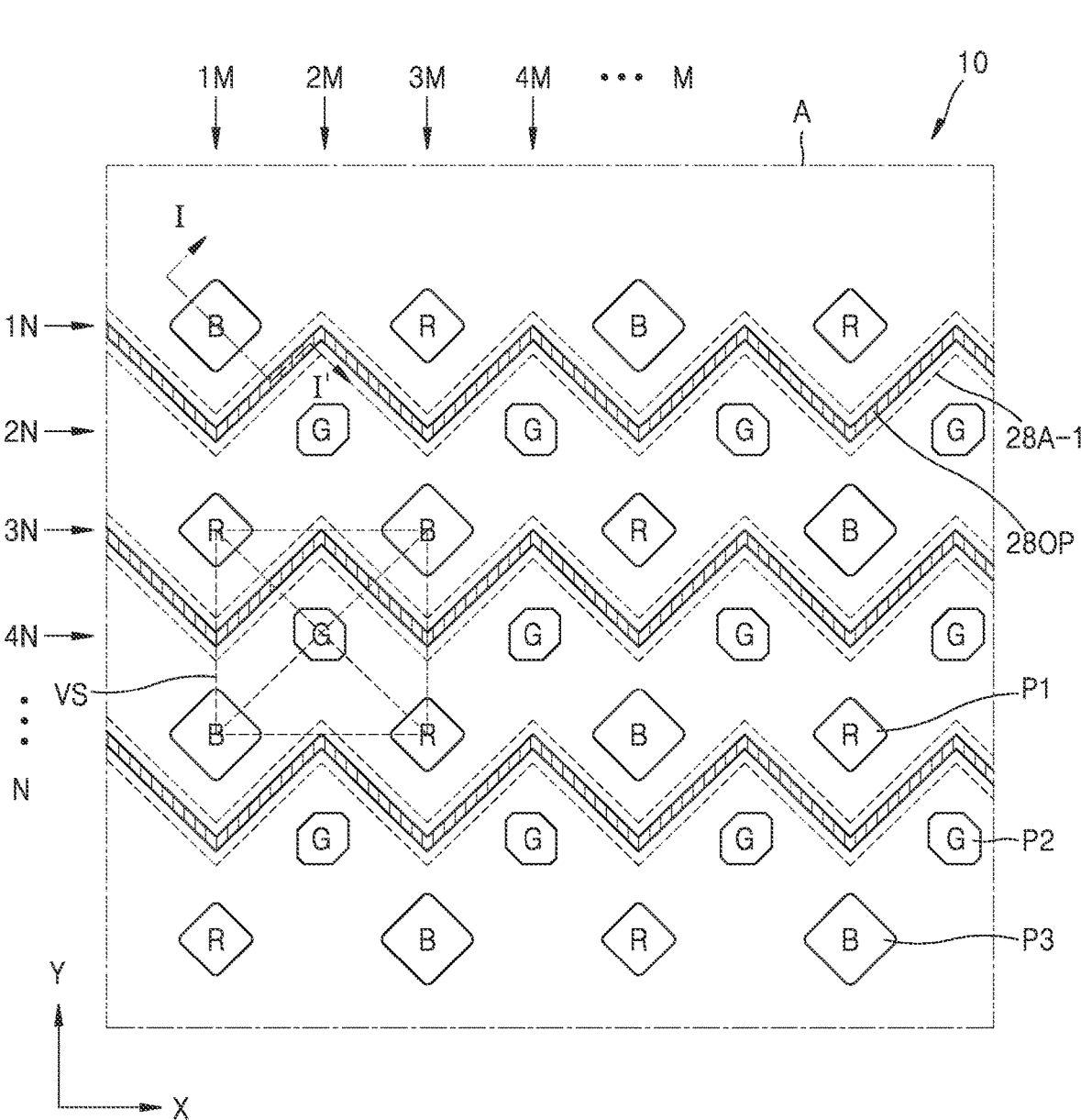
FIG. 3 is a schematic plan view of a portion of a display apparatus according to an embodiment.

FIG. 3 is a schematic plan view of a portion of a display apparatus according to an embodiment.

Referring to FIG. 3, a plurality of sub-pixels may be arranged at (e.g., in or on) the display area DA of the display apparatus 10. As used in the present specification, a sub-pixel refers to a minimum unit that implements an image, and denotes an emission area. When an organic light-emitting diode is used as a display element, the emission area may be defined by an opening in a bank layer, which is described in more detail below.

As shown in FIG. 3, the sub-pixels arranged at (e.g., in or on) the display area DA may be arranged in an RGBG structure (e.g., a PENTILE® structure, PENTILE® being a duly registered trademark of Samsung Display Co., Ltd.). The first sub-pixel P1, the second sub-pixel P2, and the third sub-pixel P3 may implement a red color, a green color, and a blue color, respectively.

The first sub-pixels P1 and the third sub-pixels P3 are alternately arranged along a first row 1N. The second sub-pixels P2 are arranged at suitable intervals (e.g., predetermined or certain intervals) along a second row 2N adjacent to the first row 1N. The third sub-pixels P3 and the first sub-pixels P1 are alternately arranged along a third row 3N adjacent to the second row 2N. the second sub-pixels P2 are arranged at suitable intervals (e.g., predetermined or certain intervals) along a fourth row 4N adjacent to the third row 3N. The above-described sub-pixel arrangement is repeated to an $N^{th}$ row, where N is a natural number. In this case, the third sub-pixel P3 and the first sub-pixel P1 may be greater in size than that of the second sub-pixel P2.

The first sub-pixels P1 and the third sub-pixels P3 in the first row 1N and the second sub-pixels P2 in the second row 2N are alternately arranged. Therefore, the first sub-pixels P1 and the third sub-pixels P3 are alternately arranged along a first column 1M. The second sub-pixels P2 are arranged at suitable intervals (e.g., predetermined or certain intervals) along a second column 2M adjacent to the first column 1M. The third sub-pixels P3 and the first sub-pixels P1 are alternately arranged along a third column 3M adjacent to the second column 2M. The second sub-pixels P2 are arranged at suitable intervals (e.g., predetermined or certain intervals) along a fourth column 4M adjacent to the third column 3M. The above-described sub-pixel arrangement is repeated to an $M^{th}$ column, where M is a natural number.

When the sub-pixel arrangements are expressed differently, it may be described that the first sub-pixels P1 are arranged on first and third vertices that face away from each other (e.g., that are opposite to each other) from among vertices of a virtual quadrangle VS of which a center point thereof is a center point of the second sub-pixel P2, and that the third sub-pixels P3 are arranged on second and fourth vertices of the virtual quadrangle VS. In this case, the virtual quadrangle VS may be variously modified, for example, to have a shape of a rectangle, a rhombus, a square, or the like.

The above sub-pixel arrangement may be referred to as an RGBG matrix structure or an RGBG structure (e.g., a PENTILE® matrix structure or a PENTILE® structure), and may implement a high resolution with a smaller number of pixels by performing rendering during which colors are expressed by sharing adjacent pixels.

FIG. 3 shows an example in which a plurality of main sub-pixels are arranged in the RGBG matrix structure (e.g., the PENTILE® matrix structure), but the present disclosure is not limited thereto. For example, the main sub-pixels may be arranged in various suitable forms, such as a stripe form, a mosaic arrangement form, and/or a delta arrangement form.

Still referring to FIG. 3, auxiliary electrodes 28A-1 may be arranged at (e.g., in or on) the display area DA. The auxiliary electrodes 28A-1 are located at (e.g., in or on) a portion of the display area DA where the first sub-pixel P1 to the third sub-pixel P3 are not arranged (hereinafter referred to as a non-display area). The auxiliary electrodes 28A-1 may each be a line configured to apply the common power voltage ELVSS (e.g., see FIG. 2). The auxiliary electrodes 28A-1 may extend in a first direction (e.g., an x direction) at (e.g., in or on) the non-display area, and may be spaced apart from each other along a second direction (e.g., a y direction) crossing the first direction. The auxiliary electrodes 28A-1 may be arranged to be spaced apart from each other, and the light-emitting diodes (e.g., the organic light-emitting diodes) may be arranged between two adjacent auxiliary electrodes 28A-1. In an embodiment, as shown in FIG. 3, the first sub-pixel P1, the second sub-pixel P2, and the third sub-pixel P3 are arranged between two adjacent auxiliary electrodes 28A-1.

The auxiliary electrodes 28A-1 may extend in the first direction, and cross a non-display area between the second sub-pixel P2 and the first sub-pixel P1, and a non-display area between the second sub-pixel P2 and the third sub-pixel P3. In this case, because the second sub-pixel P2 is arranged alternately with the first sub-pixel P1 and the third sub-pixel P3 in different rows, the auxiliary electrodes 28A-1 may be arranged at (e.g., in or on) the non-display areas in a zigzag pattern on a plane (e.g., in a plan view). In more detail, a first portion of the auxiliary electrode 28A-1 may extend in a direction inclined at about 45 degrees with respect to the first direction, to cross a non-display area between the third sub-pixel P3 in the first row 1N and the second sub-pixel P2 in the second row 2N. A second portion of the auxiliary electrode 28A-1 may extend in a direction inclined at about 45 degrees with respect to the first direction, to cross a non-display area between the second sub-pixel P2 in the second row 2N and the first sub-pixel P1 in the first row 1N. The first portion and the second portion of the auxiliary electrode 28A-1 may extend in directions that are perpendicular to or substantially perpendicular to each other. The first portion and the second portion of the auxiliary electrode 28A-1 may be repeatedly arranged at (e.g., in or on) the non-display areas between the sub-pixels in the first row 1N and the second row 2N. The auxiliary electrodes 28A-1 in a zigzag pattern may also be arranged at (e.g., in or on) the non-display areas between the sub-pixels in the third row 3N and the fourth row 4N, and may be arranged to be spaced apart from each other. The structure illustrated in FIG. 3 is a portion of the display area DA, and it may be considered that the structure illustrated in FIG. 3 is repeatedly arranged at (e.g., in or on) the display area DA.

The auxiliary electrode 28A-1 may contact an opposite electrode 28C (e.g., see FIG. 4) that is integrally formed to cover the display area DA. When the display area DA has a relatively great area (e.g., a relatively large size), an IR drop may occur in the opposite electrode 28C, and thus, a brightness difference between the sub-pixels may occur. In this case, as electrical signals are allowed to be transmitted through the auxiliary electrodes 28A-1 that contact the opposite electrode 28C and have a high electrical conductivity, an IR drop, which may be caused in the opposite electrode 28C when there are no auxiliary electrodes 28A-1, may be prevented or reduced. So that the auxiliary electrodes 28A-1 contact the opposite electrode 28C, upper layers of the auxiliary electrodes 28A-1 may include first openings 28OP exposing portions of the auxiliary electrodes 28A-1. Because the first opening 28OP exposes a portion of the auxiliary electrode 28A-1 and contacts the opposite electrode 28C, the first opening 28OP may overlap with a pattern in which the auxiliary electrodes 28A-1 are arranged. In more detail, as shown in FIG. 3, the first opening 28OP may be arranged in a straight or substantially straight line on a plane (e.g., in a plan view) along the auxiliary electrodes 28A-1 arranged in a zigzag form on a plane (e.g., in a plan view). In other words, the first openings 28OP may also be formed in a zigzag pattern along the pattern in which the auxiliary electrodes 28A-1 are arranged. When the first sub-pixel P1, the second sub-pixel P2, and the third sub-pixel P3 are arranged in an RGBG structure (e.g., a PEN-TILE® structure), the sub-pixels are densely arranged at (e.g., in or on) the display area DA, and thus, it may be difficult to place an area on the auxiliary electrode 28A-1 where the first opening 28OP is formed. However, as described above, because the auxiliary electrode 28A-1 and the first opening 28OP extend and are arranged in the zigzag pattern at (e.g., in or on) the non-display area, the IR drop in the opposite electrode 28C may be effectively prevented or reduced. The structures of the auxiliary electrode 28A-1 and the first opening 28OP are described in more detail below with reference to FIG. 4.

Figure 4:
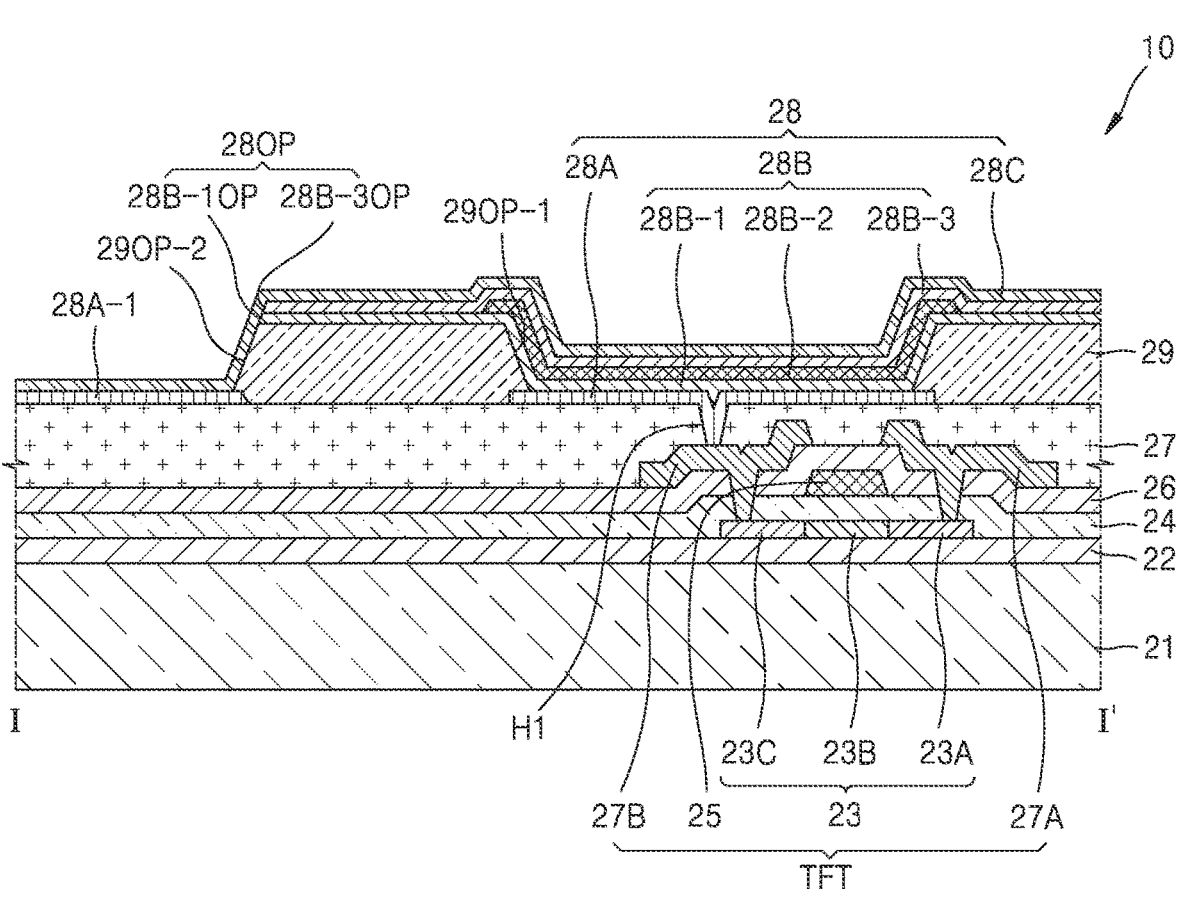
FIG. 4 is a cross-sectional view of the display apparatus taken along the line I-I' of FIG. 3.

FIG. 4 is a cross-sectional view of the display apparatus taken along the line I-I' of FIG. 3.

Referring to FIG. 4, the display apparatus 10 may include a display layer disposed on a substrate 21. The display layer may include a thin-film transistor TFT and an organic light-emitting diode 28. In this case, the thin-film transistor TFT may correspond to the driving transistor M1 of the pixel circuit PC illustrated in FIG. 2, and the organic light-emitting diode 28 may correspond to the light-emitting diode LED. The thin-film transistor TFT may be formed on the substrate 21, a passivation layer 27 may be formed to cover the thin-film transistor TFT, and the organic light-emitting diode 28 may be formed on the passivation layer 27.

The substrate 21 may include an insulating material, such as glass, quartz, or a polymer resin. The substrate 21 may be a rigid substrate, or a flexible substrate that is bendable, foldable, or rollable. For example, the substrate 21 may include a polymer resin, such as polyethersulphone, poly-acrylate, polyetherimide, polyethylene naphthalate, polyethylene terephthalate, polyphenylene sulfide, polyarylate, polyimide, polycarbonate, or cellulose acetate propionate. The substrate 21 may have a multilayered structure that includes a layer including the above-described polymer resin, and an inorganic layer. For example, the substrate 21 may include two layers including the above-described polymer resin, and an inorganic barrier layer arranged therebetween.

On an upper surface of the substrate 21, a buffer layer 22 including an organic compound and/or an inorganic compound may be further arranged. For example, the buffer layer 22 may include silicon oxide (SiOx) (x≥1) and/or silicon nitride (SiNx) (x≥1).

After a semiconductor layer 23 arranged in a suitable pattern (e.g., a predetermined or certain pattern) is formed on the buffer layer 22, the semiconductor layer 23 may be buried (e.g., may be covered) by a gate insulating layer 24. The semiconductor layer 23 may include a source area 23A and a drain area 23C, and may further include a channel area 23B between the source area 23A and the drain area 23C.

The semiconductor layer 23 may contain various suitable materials. For example, the semiconductor layer 23 may contain an inorganic semiconductor material, such as amorphous silicon or crystalline silicon. As another example, the semiconductor layer 23 may contain an oxide semiconductor. As another example, the semiconductor layer 23 may contain an organic semiconductor material. The source area 23A and the drain area 23C of the semiconductor layer 23 are doped with impurities according to a kind of the thin-film transistors, such as the driving thin-film transistor and the switching thin-film transistor.

The gate insulating layer 24 may be disposed between the semiconductor layer 23 and a gate electrode 25. The gate insulating layer 24 may include an inorganic insulating material, such as SiNx, SiOx, and/or silicon oxynitride (SiON).

On an upper surface of the gate insulating layer 24, the gate electrode 25 corresponding to the semiconductor layer 23, and an interlayer insulating layer 26 burying (e.g., covering) the gate electrode 25 are formed. The gate electrode 25 may overlap with the channel area 23B of the semiconductor layer 23. The gate electrode may include molybdenum (Mo), copper (Cu), titanium (Ti), or the like, and may have a single-layer structure or a multilayered structure including one or more of the above materials. The interlayer insulating layer 26 may cover the gate electrode 25. The interlayer insulating layer 26 may be an inorganic layer including SiON, SiOx, or SiNx. The interlayer insulating layer 26 may be a single layer or multi layers.

On the interlayer insulating layer 26, a source electrode 27A and a drain electrode 27B may be arranged. Each of the source electrode 27A and the drain electrode 27B may include aluminum (Al), Cu, Ti, or the like, and may be a single layer or multi layers. In an embodiment, the source electrode 27A and the drain electrode 27B may each have a multilayered structure of Ti/Al/Ti. The source electrode 27A and the drain electrode 27B may be connected to the source area 23A and the drain area 23C of the semiconductor layer 23, respectively, through contact holes.

The passivation layer 27 is formed on the thin-film transistor TFT, and a pixel electrode 28A (e.g., a first electrode) of the organic light-emitting diode 28 is formed on the passivation layer 27. The pixel electrode 28A may contact the drain electrode 27B of the thin-film transistor TFT through a contact hole H1 in (e.g., penetrating) the passivation layer 27. In another embodiment, the pixel electrode 28A may contact the source electrode 27A. The passivation layer 27 may include an inorganic material and/or an organic material, and be a single layer or two or more layers. The passivation layer 27 may be a planar layer to have a flat or substantially flat upper surface regardless of the unevenness of a lower layer, or may be a layer that is curved along the unevenness of a lower layer under (e.g., underneath) the passivation layer 27.

The pixel electrode 28A may include a conductive oxide, such as indium tin oxide (ITO), indium zinc oxide (IZO), zinc oxide (ZnO), indium oxide (In₂O₃), indium gallium oxide (IGO), or aluminum zinc oxide (AZO). The pixel electrode 28A may include a reflection layer including silver (Ag), magnesium (Mg), Al, platinum (Pt), palladium (Pd), gold (Au), nickel (Ni), neodymium (Nd), iridium (Ir), chromium (Cr), or a suitable compound thereof. For example, the pixel electrode 28A may have a structure in which layers including ITO, IZO, ZnO, or In₂O₃ are arranged above/under the above-described reflection layer. In this case, the pixel electrode 28A may have a stacked structure of ITO/Ag/ITO.

On an upper portion of the passivation layer 27, the auxiliary electrode 28A-1 is arranged to be spaced apart from the pixel electrode 28A. The auxiliary electrode 28A-1 may include the same material and be formed through the same process as those of the pixel electrode 28A. The auxiliary electrode 28A-1 may contact the opposite electrode 28C described in more detail below. The auxiliary electrode 28A-1 may contact the opposite electrode 28C through the first opening 28OP formed in (e.g., penetrating) a first auxiliary layer 28B-1 and a second auxiliary layer 28B-3.

After the pixel electrode 28A and the auxiliary electrode 28A-1 are formed on the passivation layer 27, the bank layer 29 formed of an organic material and/or an inorganic material may be formed to cover the pixel electrode 28A and the passivation layer 27. The bank layer 29 may cover edges of the pixel electrode 28A and the auxiliary electrode 28A-1, and the pixel electrode 28A is exposed through an open portion of the bank layer 29. In other words, the bank layer 29 may include a first bank opening 29OP-1 exposing a portion of the pixel electrode 28A, and a second bank opening 29OP-2 exposing a portion of the auxiliary electrode 28A-1. The first bank opening 29OP-1 may overlap with a central portion of the pixel electrode 28A, and the second bank opening 29OP-2 may overlap with a central portion of the auxiliary electrode 28A-1. The second bank opening 29OP-2 of the bank layer 29 may be formed concurrently (e.g., simultaneously or substantially simultaneously) with the first bank opening 29OP-1 through the same process as each other, but may be formed concurrently (e.g., simultaneously or substantially simultaneously) with the first opening 28OP in an intermediate layer 28B.

The intermediate layer 28B and the opposite electrode 28C (e.g., a second electrode) are formed on the pixel electrode 28A. The opposite electrode 28C may be formed at (e.g., in or on) the entire display area DA. In this case, the opposite electrode 28C may be formed on the intermediate layer 28B and the bank layer 29. Hereinafter, for convenience, a case where the opposite electrode 28C is formed on the intermediate layer 28B and the bank layer 29 is described in more detail.

The pixel electrode 28A functions as an anode, and the opposite electrode 28C functions as a cathode, or vice versa. The pixel electrode 28A is insulated from the opposite electrode 28C by the intermediate layer 28B, and by applying voltages having different polarities to the intermediate layer 28B, an organic emission layer may emit light.

The intermediate layer 28B may include an organic emission layer 28B-2. As another example, the intermediate layer 28B may include the organic emission layer 28B-2, and at least one of the first auxiliary layer 28B-1 or the second auxiliary layer 28B-3. In this case, the first auxiliary layer 28B-1 may include at least one of a hole injection layer or a hole transport layer, and the second auxiliary layer 28B-3 may include at least one of an electron transport layer or an electron injection layer. In this case, the first auxiliary layer 28B-1 may be arranged between the organic emission layer 28B-2 and the pixel electrode 28A, and the second auxiliary layer 28B-3 may be arranged between the organic emission layer 28B-2 and the opposite electrode 28C. However, the present disclosure is not limited thereto, and the intermediate layer 28B may include the organic emission layer 28B-2, and may further include various suitable functional layers. Hereinafter, for convenience, a case where the intermediate layer 28B includes the first auxiliary layer 28B-1, the organic emission layer 28B-2, and the second auxiliary layer 28B-3 is described in more detail.

The intermediate layer 28B may be provided in a plurality, so that at least one of the intermediate layers 28B may be spaced apart from the others. For example, the organic emission layers 28B-2 may be arranged to be spaced apart from each other in the entire display area DA. In this case, the organic emission layers 28B-2 may correspond to the sub-pixels, respectively, and depending on the materials included in the organic emission layers 28B-2, the sub-pixels may emit different colors of light from one another. In another embodiment, at least one of the first auxiliary layers 28B-1 and the second auxiliary layers 28B-3, other than the organic emission layers 28B-2, may be arranged to be spaced apart from each other to correspond to the organic emission layer 28B-2. In another embodiment, the organic emission layers 28B-2 may be arranged to be spaced apart from each other, and at least one of the first auxiliary layers 28B-1 and the second auxiliary layers 28B-3 may cover the entire display area DA. Hereinafter, for convenience, the organic emission layers 28B-2 that are arranged to be spaced apart from each other to form a pattern in the display area DA, and the first auxiliary layers 28B-1 and the second auxiliary layers 28B-3 are entirely arranged at (e.g., in or on) the display area DA, will be described in more detail.

Because the auxiliary electrode 28A-1 contacts the opposite electrode 28C, the intermediate layer 28B may include the first opening 28OP exposing a portion of the auxiliary electrode 28A-1. In more detail, the organic emission layers 28B-2 of the intermediate layer 28B may be arranged to be spaced apart from each other for respective sub-pixels, and thus, the first auxiliary layer 28B-1 and the second auxiliary layer 28B-3 may include the first opening 28OP. The first opening 28OP may include a first auxiliary layer open portion 28B-1OP of the first auxiliary layer 28B-1, and a second auxiliary layer open portion 28B-3OP of the second auxiliary layer 28B-3. The first auxiliary layer open portion 28B-1OP, the second auxiliary layer open portion 28B-3OP, and the second bank opening 29OP-2 may overlap with each other, and the auxiliary electrode 28A-1 may be exposed to the outside in an area where the first auxiliary layer open portion 28B-1OP, the second auxiliary layer open portion 28B-3OP, and the second bank opening 29OP-2 overlap with each other.

The opposite electrode 28C may be arranged on the intermediate layer 28B. The opposite electrode 28C may include a conductive material having a low work function. For example, the opposite electrode 28C may include a transparent (or translucent) layer, including Ag, Mg, Al, Pt, Pd, Au, Ni, Nd, Ir, Cr, lithium (Li), calcium (Ca), or a suitable alloy thereof. As another example, the opposite electrode 28C may further include a layer including ITO, IZO, ZnO, or $In_2O_3$ on the transparent (or translucent) layer including one or more of the above-described materials. The opposite electrode 28C may be integrally formed to correspond to the organic light-emitting diodes OLEDs included at (e.g., in or on) the display area DA.

In this case, an upper portion of the auxiliary electrode 28A-1 arranged at (e.g., in or on) the non-display area between the sub-pixels may be exposed to the outside by the second bank opening 29OP-2 of the bank layer 29 and the first opening 28OP of the intermediate layer 28B, and thus, the auxiliary electrode 28A-1 may contact the opposite electrode 28C in an area where the first opening 28OP overlaps with the second bank opening 29OP-2. Accordingly, the occurrence of an IR drop may decrease, by reducing the resistance of the opposite electrode 28C. For example, when the opposite electrode 28C has a small thickness, the resistance of the opposite electrode 28C increases, and thus, the IR drop may occur. In this case, the resistance of the opposite electrode 28C may be reduced by connecting the auxiliary electrode 28A-1 to the opposite electrode 28C.

Figure 5:
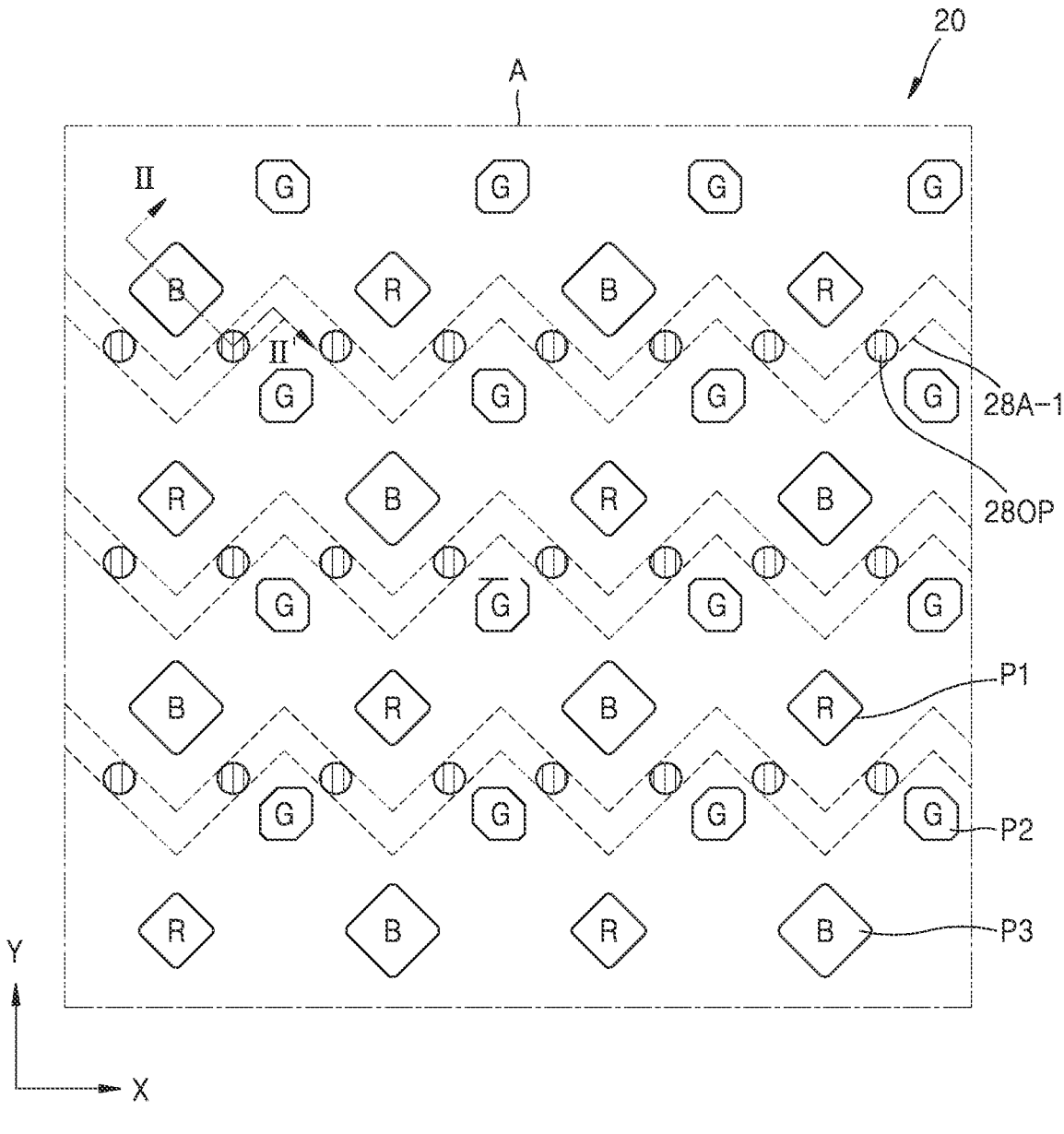
FIG. 5 is a schematic plan view of a portion of a display apparatus according to another embodiment.
Figure 6:
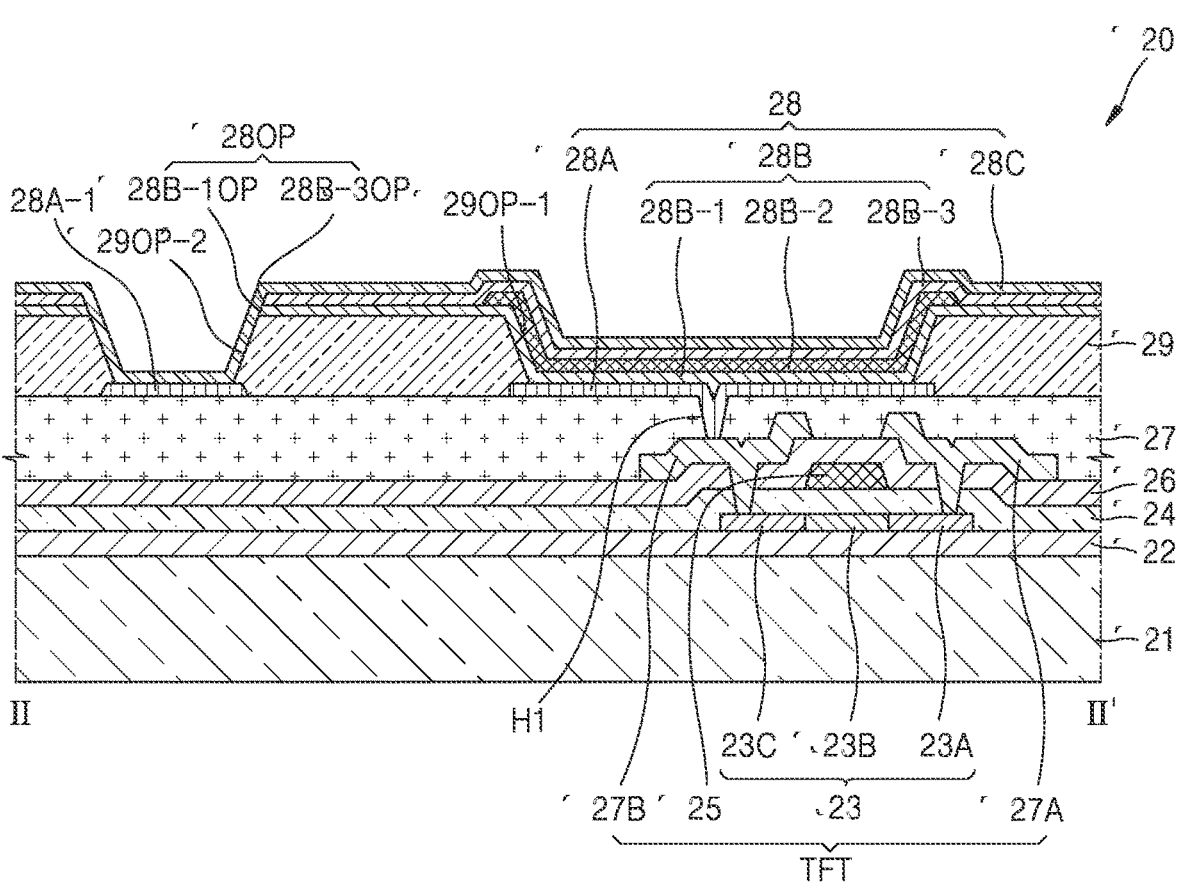
FIG. 6 is a cross-sectional view of the display apparatus taken along the line II-II' of FIG. 5.

FIG. 5 is a schematic plan view of a portion of a display apparatus according to another embodiment. FIG. 6 is a cross-sectional view of the display apparatus taken along the line II-II' of FIG. 5. Referring to FIGS. 5 and 6, except for features regarding the first opening 28OP, the other features therein are the same or substantially the same as those described above with reference to FIGS. 3 and 4, and thus, redundant description thereof may not be repeated, and the differences therebetween may be mainly described hereinafter.

Referring to FIG. 4, the sub-pixels arranged at (e.g., in or on) the display area DA may be arranged in an RGBG structure (e.g., a PENTILE® structure). Also, the auxiliary electrodes 28A-1 may be arranged at (e.g., in or on) the display area DA, and the auxiliary electrodes 28A-1 may extend at (e.g., in or on) the non-display area in the first direction in a zigzag pattern on a plane (e.g., in a plan view).

Because the auxiliary electrode 28A-1 contacts the opposite electrode 28C that is integrally formed to cover the display area DA, an upper layer of the auxiliary electrode 28A-1 may include the first opening 28OP exposing a portion of the auxiliary electrode 28A-1. As described above, the first opening 28OP may be formed in the intermediate layer 28B, may include the first auxiliary layer open portion 28B-1OP and the second auxiliary layer open portion 28B-2OP, and may overlap with the center of each of the second bank opening 29OP-2 of the bank layer 29 and the auxiliary electrode 28A-1.

In other words, because the first opening 28OP exposes a portion of the auxiliary electrode 28A-1 and contacts the opposite electrode 28C, the first opening 28OP may overlap with the pattern in which the auxiliary electrodes 28A-1 are arranged. However, as shown in FIG. 5, the first openings 28OP may be formed along the auxiliary electrode 28A-1 arranged in the zigzag pattern on a plane (e.g., in a plan view), and may be formed as holes drilled into some portions of the pattern in which the auxiliary electrodes 28A-1 are arranged. In other words, the first openings 28OP may be arranged in the intermediate layer 28 arranged on the auxiliary electrode 28A-1 that is in a zigzag form on a plane (e.g., in a plan view). The hole formed by the first opening 28OP may have a circular shape, but the present disclosure is not limited thereto. The shape of the hole may be a polygon, such as a quadrangle. Also, as shown in FIG. 5, the first opening 28OP may be located in a central portion of the non-display area between the third sub-pixel P3 and the second sub-pixel P2, or a central portion of the non-display area between the first sub-pixel P1 and the second sub-pixel P2. However, the present disclosure is not limited thereto. The first openings 28OP having hole shapes may be formed in any suitable area overlapping with the zigzag pattern of the auxiliary electrode 28A-1.

In a display apparatus 20 according to another embodiment, the IR drop in the opposite electrode 28C may be effectively prevented or reduced, by extending the auxiliary electrode 28A-1 in the zigzag pattern at (e.g., in or on) the non-display area between the sub-pixels, and forming the first openings 28OP to overlap with the pattern of the auxiliary electrode 28A-1. Also, as the first openings 28OP are formed to overlap with the pattern of the auxiliary electrodes 28A-1 and to penetrate some portions of the pattern, processes such as laser drilling for forming the first openings 28OP may be simplified, and a spatial margin may be sufficiently secured. Also, because an area where the first openings 28OP are to be formed decreases, the reduction of heat generated during the process of forming the first openings 28OP and a processing time reduction may be achieved.

Figure 7:
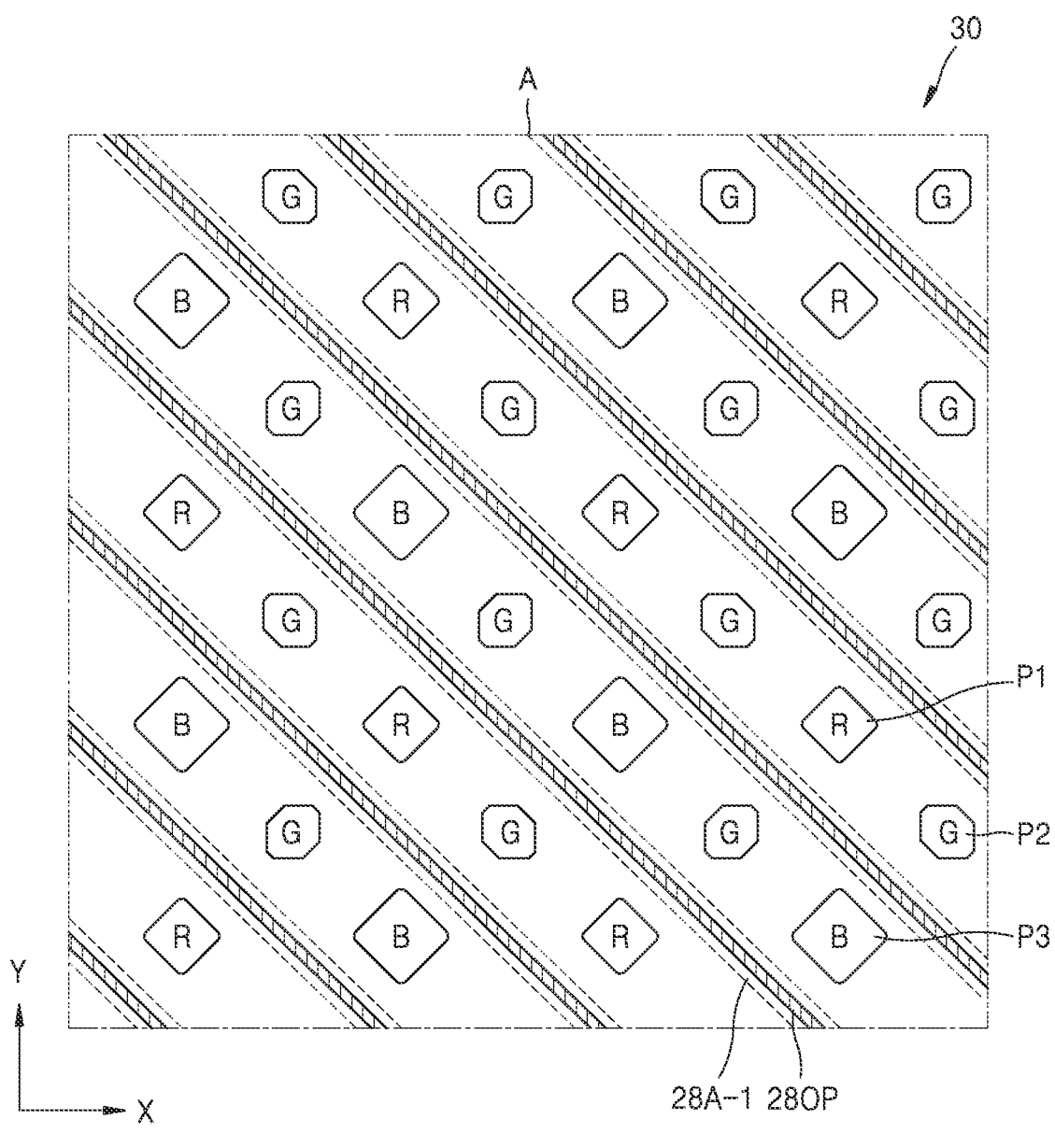
FIG. 7 is a schematic plan view of a portion of a display apparatus according to another embodiment.
Figure 8:
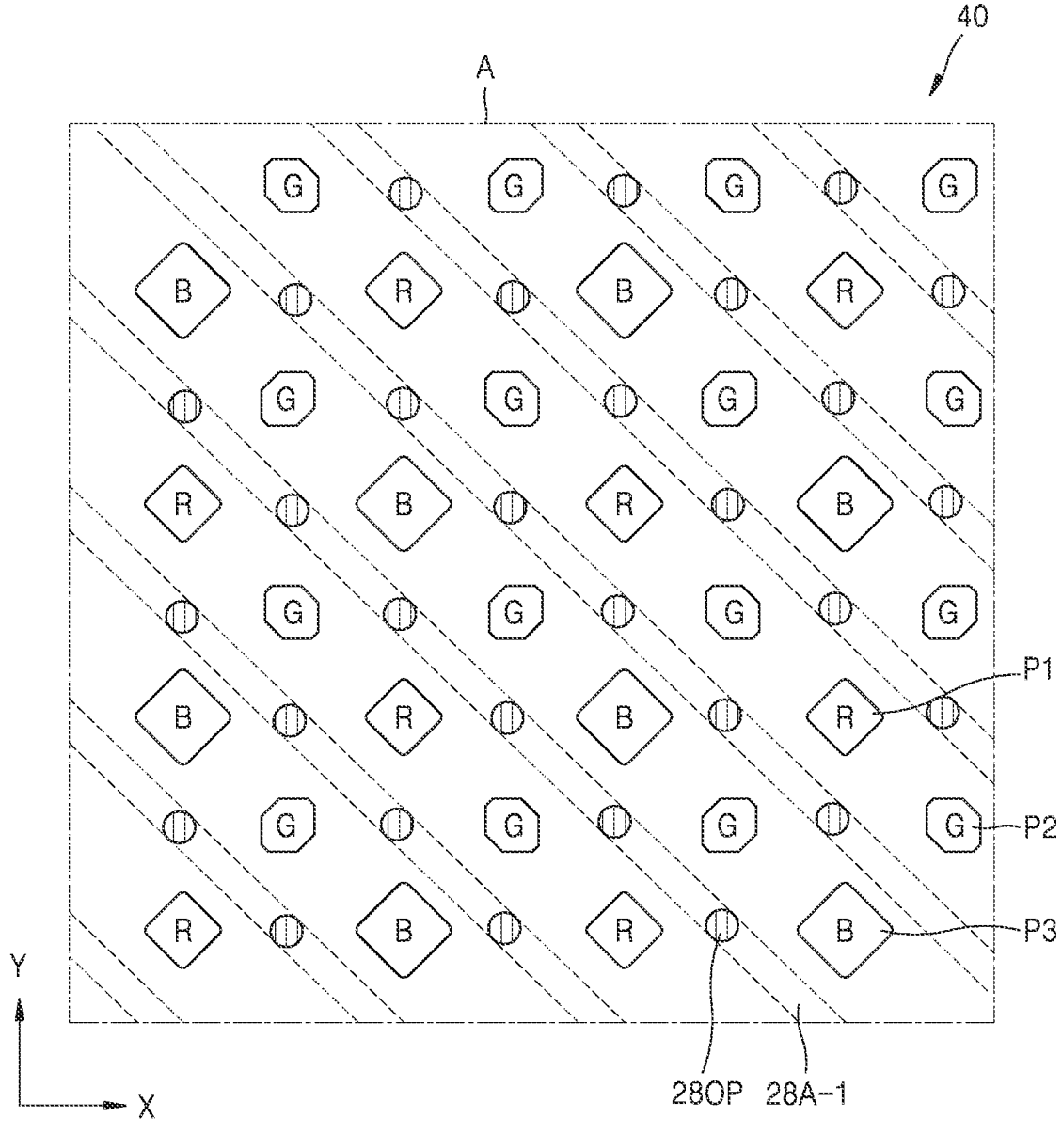
FIG. 8 is a schematic plan view of a portion of a display apparatus according to another embodiment.
Figure 9:
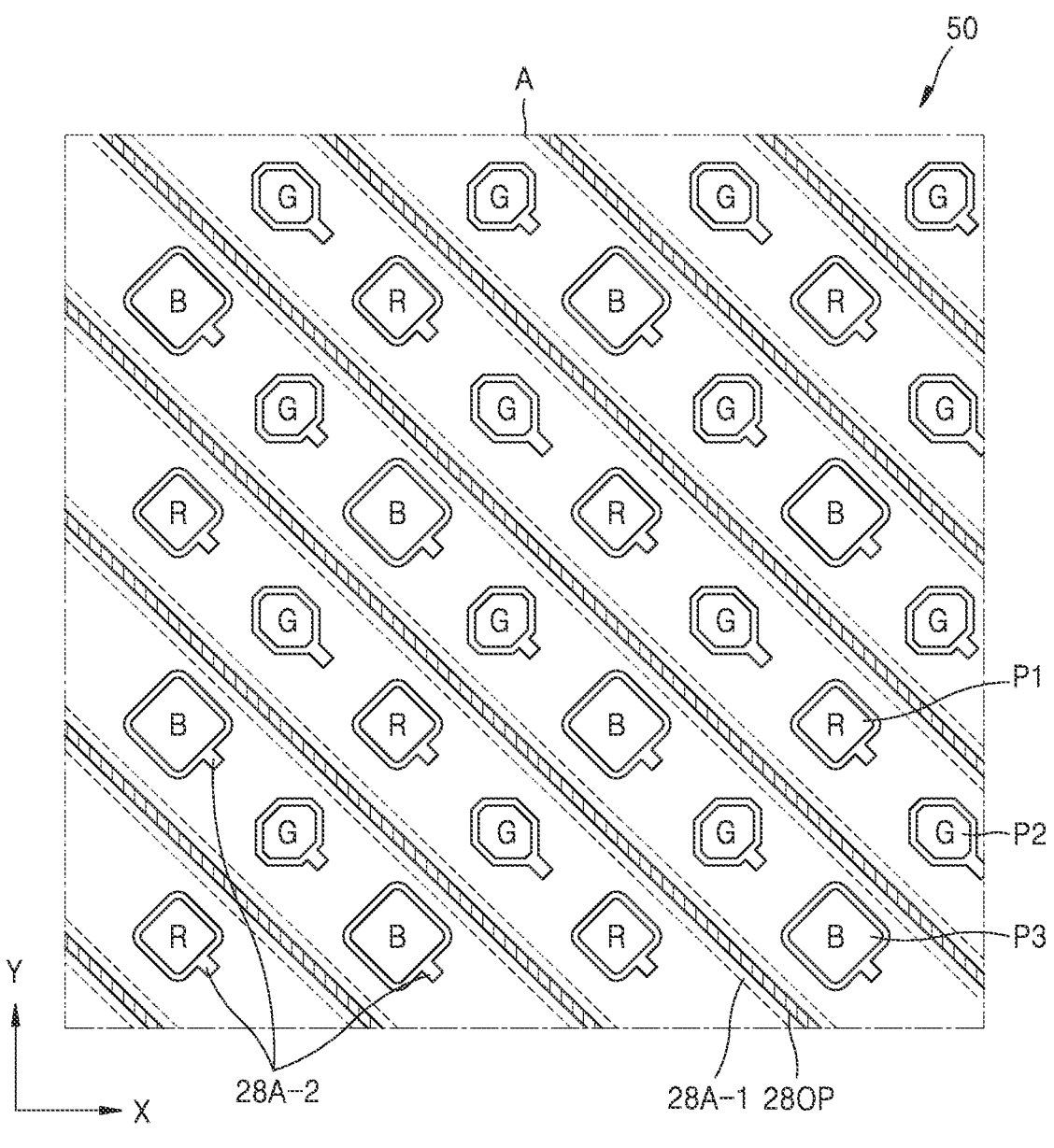
FIG. 9 is a schematic plan view of a portion of a display apparatus according to another embodiment.

FIG. 7 is a schematic plan view of a portion of a display apparatus according to another embodiment. FIG. 8 is a schematic plan view of a portion of a display apparatus according to another embodiment. FIG. 9 is a schematic plan view of a portion of a display apparatus according to another embodiment. Referring to FIGS. 7 through 9, except for features regarding the auxiliary electrode 28A-1, the first opening 28OP, and the first connection portion 28A-2, the other features therein are the same or substantially the same as those described above with reference to FIGS. 3 to 6, and thus, redundant description thereof may not be repeated, and the differences therebetween may be mainly described hereinafter.

Referring to FIG. 7, the auxiliary electrodes 28A-1 may be arranged at (e.g., in or on) the display area DA. The auxiliary electrodes 28A-1 are arranged at (e.g., in or on) a non-display area of the display area DA, where the first sub-pixel P1 to the third sub-pixel P3 are not arranged. The auxiliary electrodes 28A-1 may each be a line configured to apply the common power voltage ELVSS (e.g., see FIG. 2).

The auxiliary electrode 28A-1 may extend to cross a non-display area between the second sub-pixel P2 and the first sub-pixel P1, and a non-display area between the second sub-pixel P2 and the third sub-pixel P3. As another example, the auxiliary electrode 28A-1 may extend in a direction inclined at about 45 degrees between the first direction (e.g., the x direction) and the second direction (e.g., the y direction). In other words, the auxiliary electrode 28A-1 may extend in a straight or substantially straight line in a direction parallel or substantially parallel with a virtual diagonal line on which the first sub-pixels P1 and the second sub-pixels P2 are alternately arranged on a plane (e.g., in a plan view). Also, the auxiliary electrode 28A-1 may extend in a straight or substantially straight line in a direction parallel or substantially parallel with a virtual diagonal line on which the third sub-pixels P3 and the second sub-pixels P2 are alternately arranged on a plane (e.g., in a plan view). In other words, the auxiliary electrode 28A-1 may extend in a direction parallel or substantially parallel with a virtual diagonal direction in which the center of the first sub-pixel P1 in an $N^{th}$ row is connected to the center of the first sub-pixel P1 in an $(N+2)^{th}$ row. The auxiliary electrodes 28A-1 may be arranged to be spaced apart from each other, and parallel or substantially parallel with each other.

Also, because the auxiliary electrodes 28A-1 contact the opposite electrode 28C, the upper layers of the auxiliary electrodes 28A-1 may include the first openings 28OP exposing portions of the auxiliary electrodes 28A-1. The first opening 28OP may overlap with the pattern in which the auxiliary electrodes 28A-1 are arranged.

In more detail, referring to FIG. 7, the first openings 28OP may be arranged in a straight or substantially straight line on a plane (e.g., in a plan view) along the auxiliary electrodes 28A-1 arranged in a straight or substantially straight line in a diagonal direction on a plane (e.g., in a plan view). In other words, the first openings 28OP may be arranged in a straight or substantially straight line in a direction parallel or substantially parallel with a virtual diagonal line on which the first sub-pixels P1 and the second sub-pixels P2 are alternately arranged along the pattern in which the auxiliary electrodes 28A-1 are arranged.

As another example, referring to FIG. 8, the first openings 28OP may be formed along the auxiliary electrodes 28A-1 arranged in a straight or substantially straight line in a diagonal direction on a plane (e.g., in a plan view), and may be formed as holes drilled into some portions of the pattern in which the auxiliary electrodes 28A-1 are arranged. In other words, the first openings 28OP may be arranged in the intermediate layer 28B (e.g., see FIG. 6) arranged on upper portions of the auxiliary electrodes 28A-1 that are arranged in the diagonal direction on a plane (e.g., in a plan view). Holes in which the first openings 28OP are formed may each have a circular shape, but the present disclosure is not limited thereto. The hole may have various suitable shapes, such as a quadrangle. As shown in FIG. 8, the first openings 28OP may be arranged in a central portion of a non-display area between the second sub-pixel P2 and the second sub-pixel P2, or a central portion of a non-display area between the first sub-pixel P1 and the third sub-pixel P3. However, the present disclosure is not limited thereto. The first openings 28OP each having a hole shape may be formed in any suitable area overlapping with the diagonal pattern of the auxiliary electrode 28A-1.

In the display apparatuses 30 and 40, the auxiliary electrodes 28A-1 extend in a diagonal pattern in the non-display area between the sub-pixels, and as the first openings 28OP are formed to overlap with the pattern of the auxiliary electrodes 28A-1, the IR drop in the opposite electrode 28C may be effectively prevented or reduced. Also, as in the display apparatus 40, as the first openings 28OP are formed to overlap with the pattern of the auxiliary electrodes 28A-1, and penetrate some portions of the pattern, the processes such as the laser drilling process of forming the first openings 28OP may be simplified, and a spatial margin may be sufficiently secured. Also, because the areas where the first openings 28OP are to be formed decrease, a reduction of the heat generated during the process of forming the first openings 28OP and the processing time reduction may be achieved.

Also, as described above, when the auxiliary electrodes 28A-1 extend in the diagonal direction on a plane (e.g., in a plan view), the pixel electrodes 28A of the respective sub-pixels may include the first connection portions 28A-2 arranged in parallel or substantially parallel with the diagonal pattern in which the auxiliary electrodes 28A-1 are arranged. The first connection portion 28A-2 of the pixel electrode 28A may indicate a region including a contact hole through which the pixel electrode 28A is electrically connected to the drain electrode 27B (e.g., see FIG. 4) of the thin-film transistor. Because the first connection portion 28A-2 contacts the drain electrode 27B without overlapping with the emission area of the organic light-emitting diode 28 (e.g., see FIG. 4), the first connection portion 28A-2 may protrude from each corresponding sub-pixel. In this case, because the auxiliary electrode 28A-1 may be formed of the same material through the same process as those of the pixel electrode 28A, the auxiliary electrode 28A-1 may be spaced apart from the first connection portion 28A-2 of the pixel electrode 28A by as much as possible to sufficiently secure a process margin. Thus, as shown in FIG. 9, the first connection portion 28A-2 of the pixel electrode 28A may extend in a direction parallel or substantially parallel with the diagonal pattern of the auxiliary electrode 28A-1.

In other words, in a display apparatus 50, as the auxiliary electrode 28A-1 includes the same material as that of the pixel electrode 28A, the first connection portion 28A-2 of the pixel electrode 28A is arranged in a suitable direction to secure a process margin by as much as possible, and thus, the IR drop in the opposite electrode 28C may be effectively prevented or reduced in terms of space.

Figure 10:
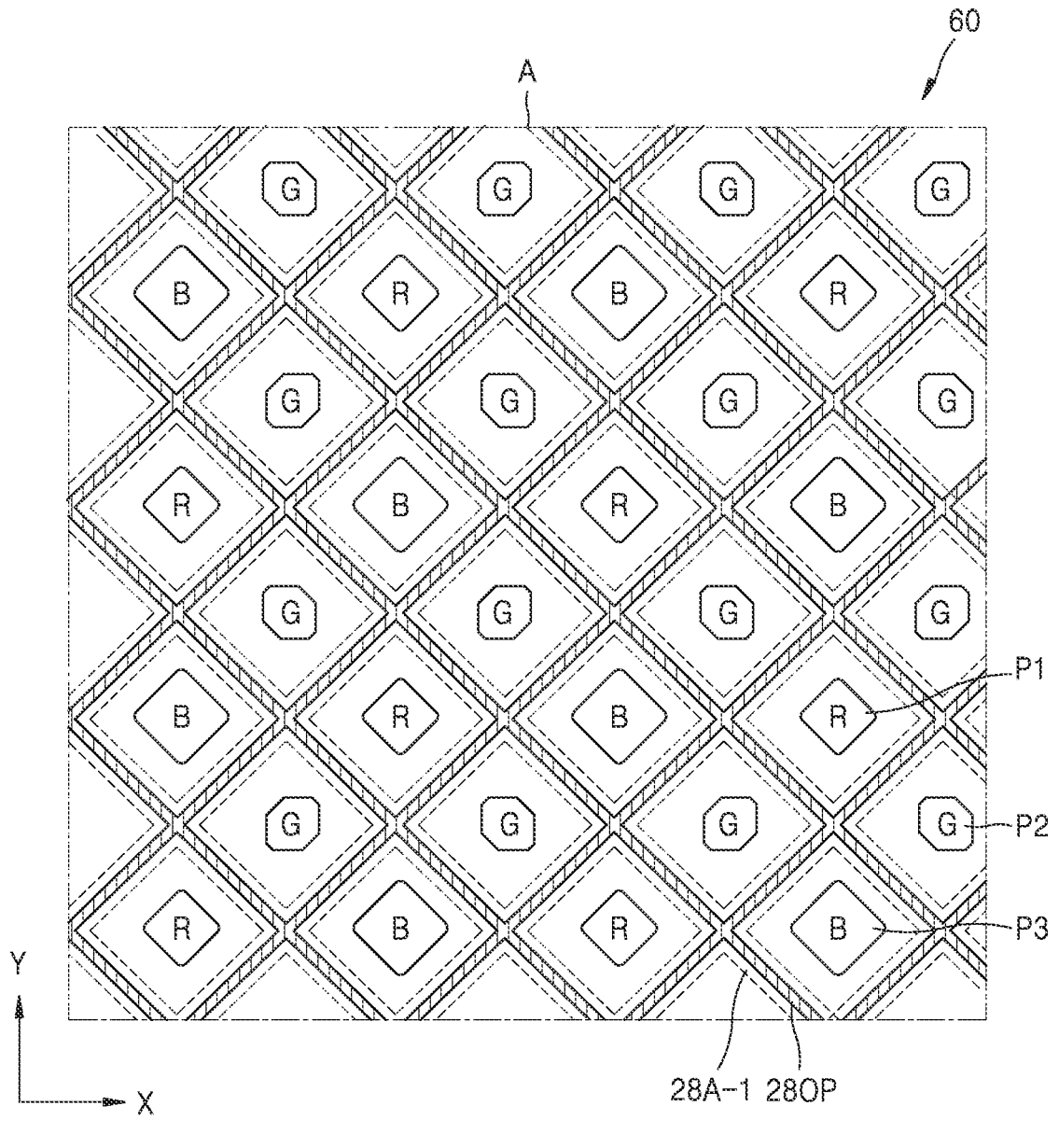
FIG. 10 is a schematic plan view of a portion of a display apparatus according to another embodiment.
Figure 11:
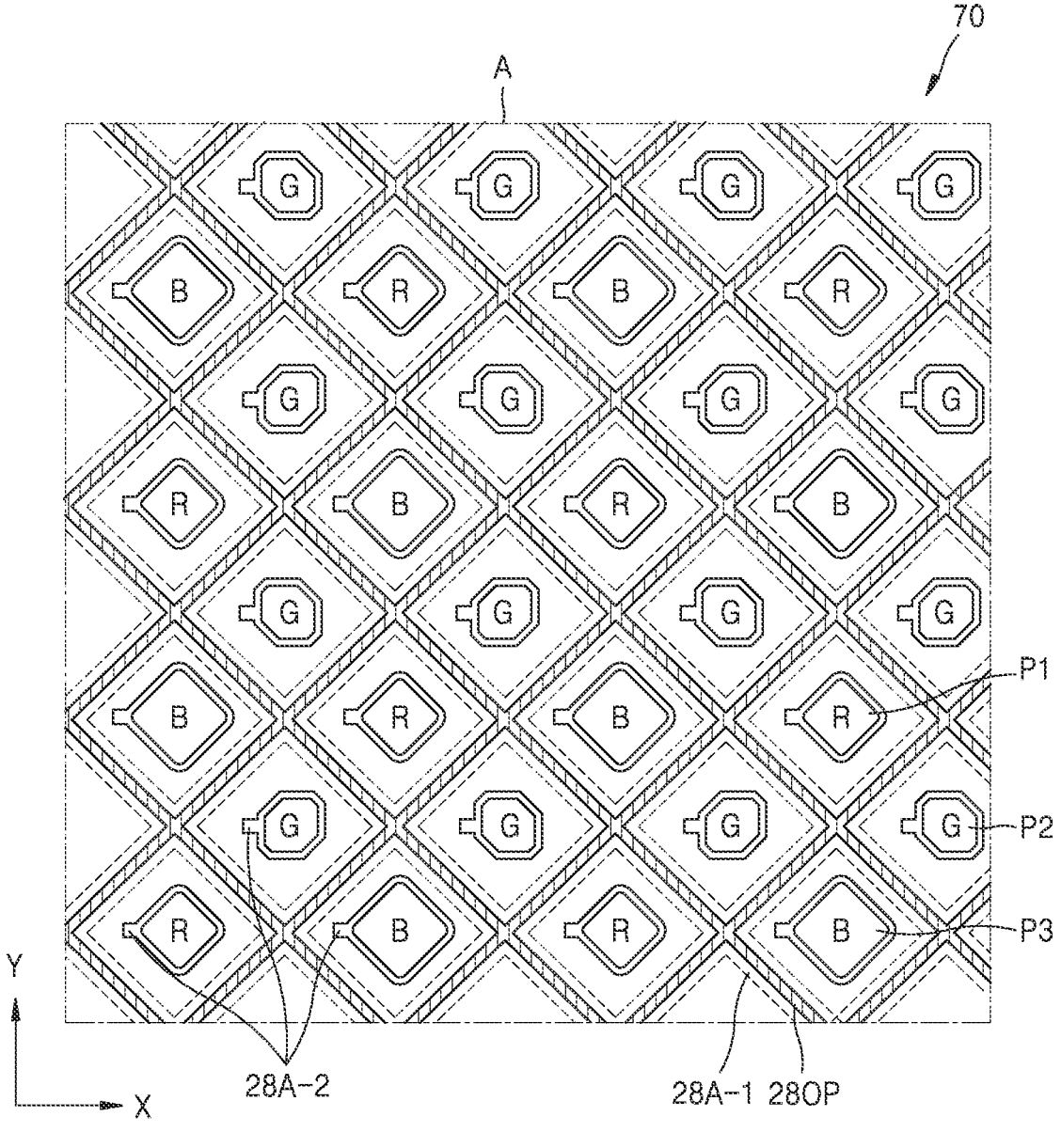
FIG. 11 is a schematic plan view of a portion of a display apparatus according to another embodiment.

FIG. 10 is a schematic plan view of a portion of a display apparatus according to another embodiment. FIG. 11 is a schematic plan view of a portion of a display apparatus according to another embodiment. Referring to FIGS. 10 and 11, except for features regarding the auxiliary electrode 28A-1 and the first connection portion 28A-2, the other features therein are the same or substantially the same as those described above with reference to FIGS. 3 to 6, and thus, redundant description thereof may not be repeated, and the differences therebetween may be mainly described in more detail hereinafter.

Referring to FIG. 10, the auxiliary electrodes 28A-1 may be arranged at (e.g., in or on) the display area DA. The auxiliary electrodes 28A-1 may be arranged at (e.g., in or on) the non-display area of the display area DA, where the first sub-pixels P1 to the third sub-pixels P3 are not arranged. The auxiliary electrodes 28A-1 may each be a line configured to apply the common power voltage ELVSS (e.g., see FIG. 2).

The auxiliary electrodes 28A-1 may extend to cross the non-display area between the second sub-pixel P2 and the first sub-pixel P1, and the non-display area between the second sub-pixel P2 and the third sub-pixel P3. The auxiliary electrodes 28A-1 may extend in a mesh pattern on a plane (e.g., in a plan view). In other words, some lines of the auxiliary electrodes 28A-1 may extend in a straight or substantially straight line in a direction parallel or substantially parallel with a virtual diagonal line on which the first sub-pixels P1 and the second sub-pixels P2 are alternately arranged on a plane (e.g., in a plan view). Other lines of the auxiliary electrodes 28A-1 may extend in a straight or substantially straight line in a direction perpendicular to or substantially perpendicular to the above-described some lines of the auxiliary electrodes 28A-1. In other words, the auxiliary electrodes 28A-1 may cross each other at (e.g., in or on) the non-display area, and may be arranged in a mesh pattern.

Also, because the auxiliary electrodes 28A-1 contact the opposite electrode 28C, the upper layers of the auxiliary electrodes 28A-1 may include the first openings 28OP exposing portions of the auxiliary electrodes 28A-1. The first opening 28OP may overlap with the pattern in which the auxiliary electrodes 28A-1 are arranged. Thus, as shown in FIG. 10, the first openings 28OP may be arranged in a straight or substantially straight line on a plane (e.g., in a plan view) along the auxiliary electrodes 28A-1 arranged in the mesh pattern on a plane (e.g., in a plan view). In other words, the first openings 28OP may also be formed in the mesh pattern along the pattern in which the auxiliary electrodes 28A-1 are arranged. However, the present disclosure is not limited thereto, and as in the display apparatus 20 shown in FIG. 5 and the display apparatus 40 shown in FIG. 8, the first openings 28OP may be formed along the auxiliary electrodes 28A-1 arranged in the mesh pattern, and may be formed as holes drilled into some portions of the pattern in which the auxiliary electrodes 28A-1 are arranged.

In the display apparatus 60, as the auxiliary electrodes 28A-1 extend in the mesh pattern at (e.g., in or on) the non-display area between the sub-pixels, and as the first openings 28OP are formed to overlap with the pattern of the auxiliary electrodes 28A-1, the IR drop in the opposite electrode 28C may be effectively reduced.

Also, when the auxiliary electrodes 28A-1 are arranged in the mesh pattern on a plane (e.g., in a plan view) as described above, the pixel electrodes 28A of the respective sub-pixels may include the first connection portions 28A-2 extending in a direction towards a corner region crossing the mesh pattern of the auxiliary electrodes 28A-1. Because the auxiliary electrodes 28A-1 may be formed of the same material through the same process as those of the pixel electrodes 28A, the auxiliary electrodes 28A-1 may be spaced apart from the pixel electrodes 28A by as much as possible, and thus, the process margin may be sufficiently secured. Thus, the first connection portion 28A-2 of the pixel electrode 28A may protrude in a direction towards a corner region crossing the auxiliary electrode 28A-1. In more detail, as shown in FIG. 11, the first connection portion 28A-2 may extend towards the corner region in the first direction (e.g., the x direction), or in other words, towards a corner of the auxiliary electrodes 28A-1. As another example, the first connection portion 28A-2 may extend towards the corner region in the second direction (e.g., the y direction).

In other words, in a display apparatus 70, as the auxiliary electrode 28A-1 includes the same material as that of the pixel electrode 28A, the first connection portion 28A-2 of the pixel electrode 28A is arranged in a suitable direction to secure a process margin by as much as possible, and thus, the IR drop in the opposite electrode 28C may be effectively prevented or reduced in terms of space.

Figure 12:
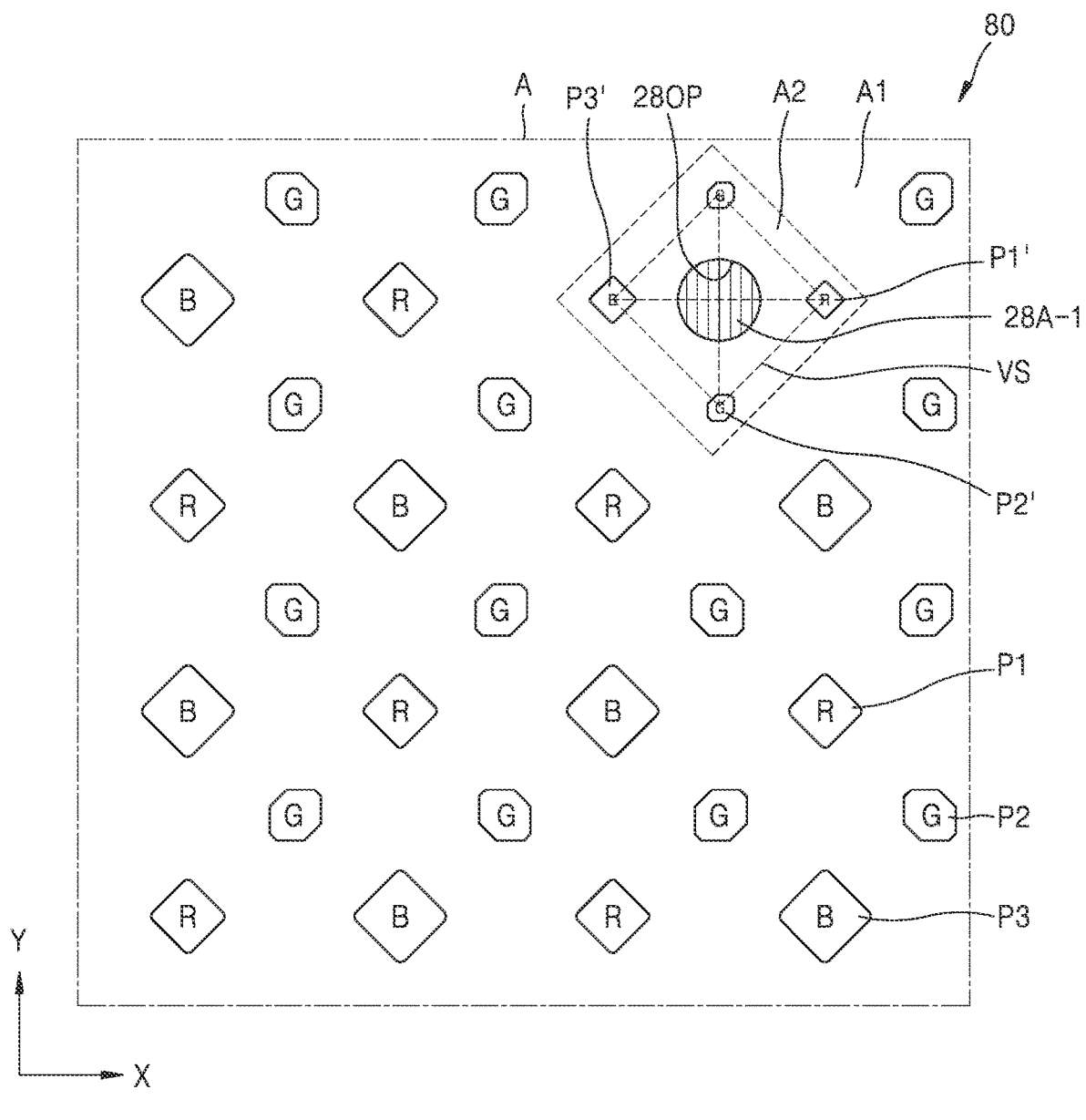
FIG. 12 is a schematic plan view of a portion of a display apparatus according to another embodiment.
Figure 13:
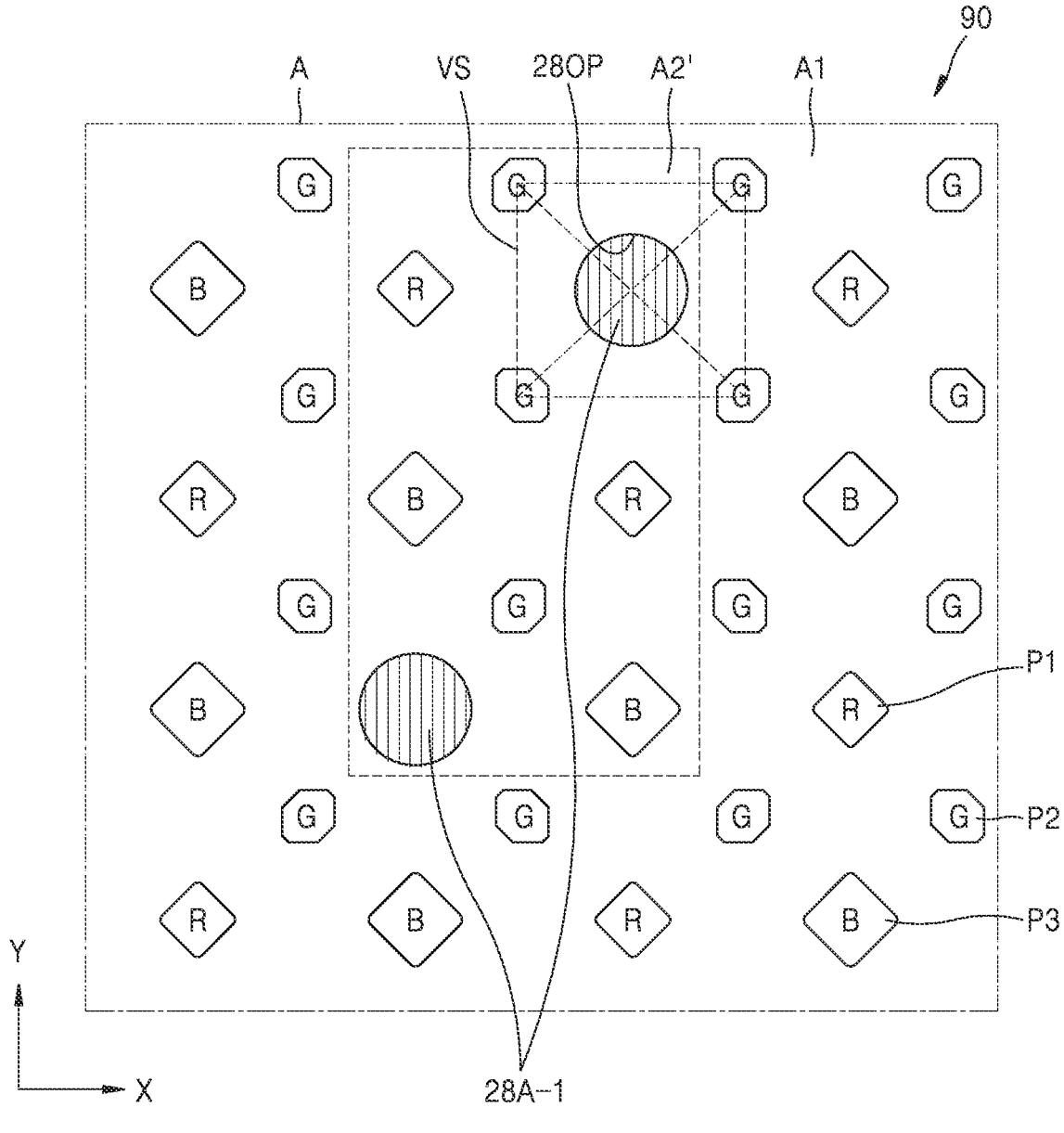
FIG. 13 is a schematic plan view of a portion of a display apparatus according to another embodiment.

FIG. 12 is a schematic plan view of a portion of a display apparatus according to another embodiment. FIG. 13 is a schematic plan view of a portion of a display apparatus according to another embodiment. Referring to FIGS. 12 and 13, except for features regarding the sub-pixels and the first openings 28OP, the other features therein are the same or substantially the same as those described above with reference to FIGS. 3 to 6, and thus, redundant description thereof may not be repeated, and the differences therebetween may be mainly described in more detail hereinafter.

Referring to FIG. 12, the display area DA may include a first display area A1 and a second display area A2. Sub-pixels arranged at (e.g., in or on) the first display area A1 and the second display area A2 may all be arranged in an RGBG structure (e.g., a PENTILE® structure). A first sub-pixel P1', a second sub-pixel P2', and a third sub-pixel P3' arranged at (e.g., in or on) the second display area A2 may be smaller in size than those of the first sub-pixel P1, the second sub-pixel P2, and the third sub-pixel P3 arranged at (e.g., in or on) the first display area A1. Emission areas of the organic light-emitting diodes 28 (e.g., see FIG. 4) arranged at (e.g., in or on) the second display area A2 may have smaller planar areas than those of emission areas of the organic light-emitting diodes 28 arranged at (e.g., in or on) the first display area A1. In other words, a non-display area of the second display area A2 may be greater than that of the first display area A1.

Referring to FIG. 13, the display area DA may include the first display area A1 and a second display area A2'. Sub-pixels arranged at (e.g., in or on) the first display area A1 and the second display area A2' may all be arranged in the RGBG structure (e.g., the PENTILE® structure). However, some of the sub-pixels arranged at (e.g., in or on) the second display area A2' may be omitted. A ratio of an area occupied by the sub-pixels in a unit area at (e.g., in or on) the first display area A1 may be greater than a ratio of an area occupied by the sub-pixels in a unit area at (e.g., in or on) the second display area A2'. In other words, the non-display area of the second display area A2' may be greater than the non-display area of the first display area A1.

Accordingly, as described above, because the auxiliary electrodes 28A-1 and the first openings 28OP may be arranged at (e.g., in or on) the non-display area, an area where the first openings 28OP may be formed may be sufficiently occupied at (e.g., in or on) the second display areas A2 and A2' when compared to the first display area A1. Thus, the first openings 28OP for preventing or reducing the IR drop in the opposite electrode 28C may be formed at (e.g., in or on) the second display areas A2 and A2'. As the areas of the sub-pixels decrease and the first openings 28OP are arranged at (e.g., in or on) the non-display area between the sub-pixels, the sub-pixels may be arranged on vertices of a virtual quadrangle having the first opening 28OP as its center. In an embodiment, in the first display area A1, the first sub-pixel P1', the second sub-pixel P2', and the third sub-pixel P3' may be arranged respectively on vertices of the virtual quadrangle having the first opening 28OP as its center. In the second display area A2, the second sub-pixels P2 may be arranged respectively on vertices of the virtual quadrangle having the first opening 28OP as its center. Accordingly, so that the auxiliary electrodes 28A-1 contact the opposite electrode 28C, a spatial margin may be sufficiently secured in a process of exposing part of the auxiliary electrodes 28A-1, for example, such as in a laser drilling process.

Figure 14:
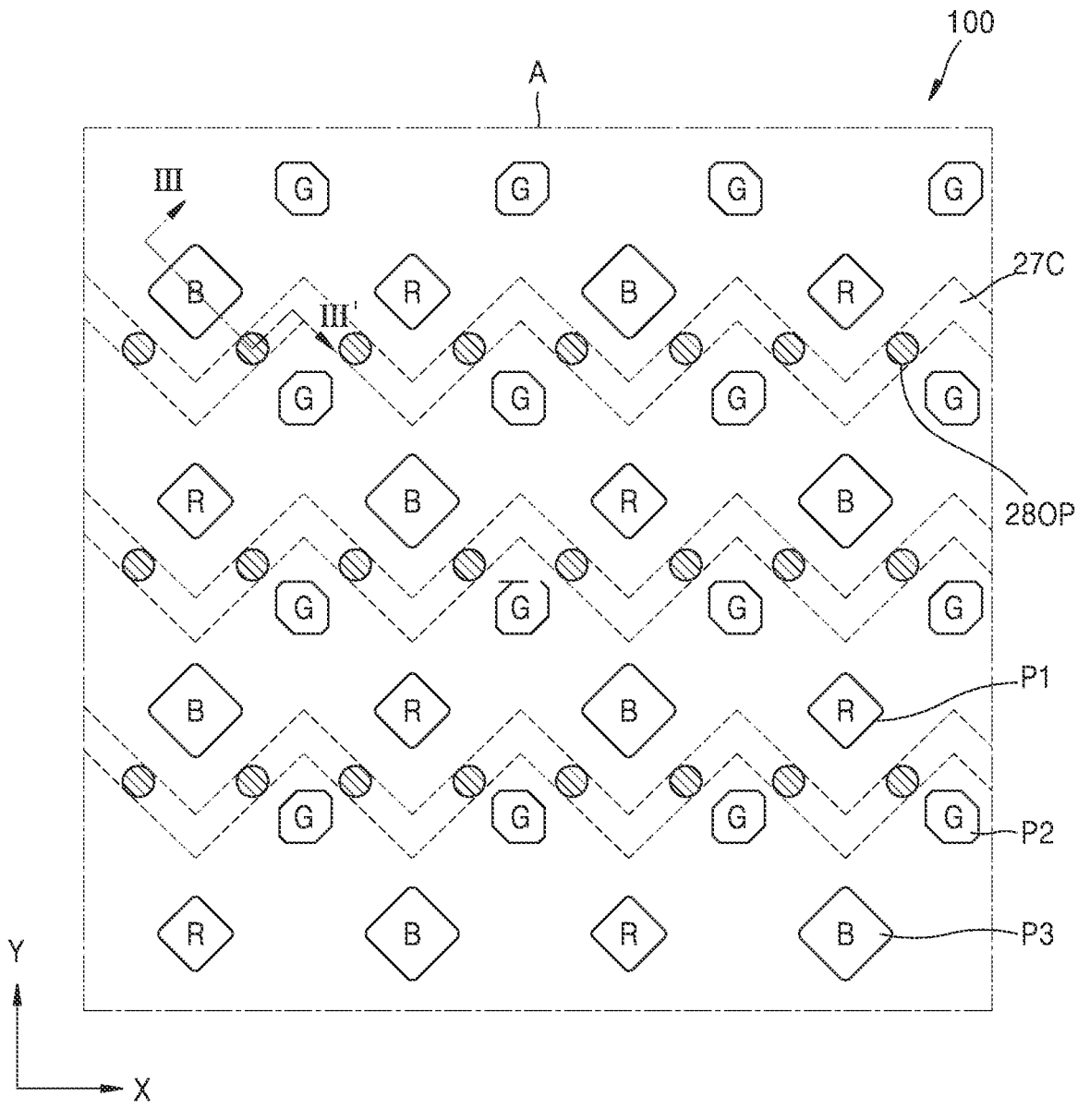
FIG. 14 is a schematic plan view of a portion of a display apparatus according to another embodiment.
Figure 15:
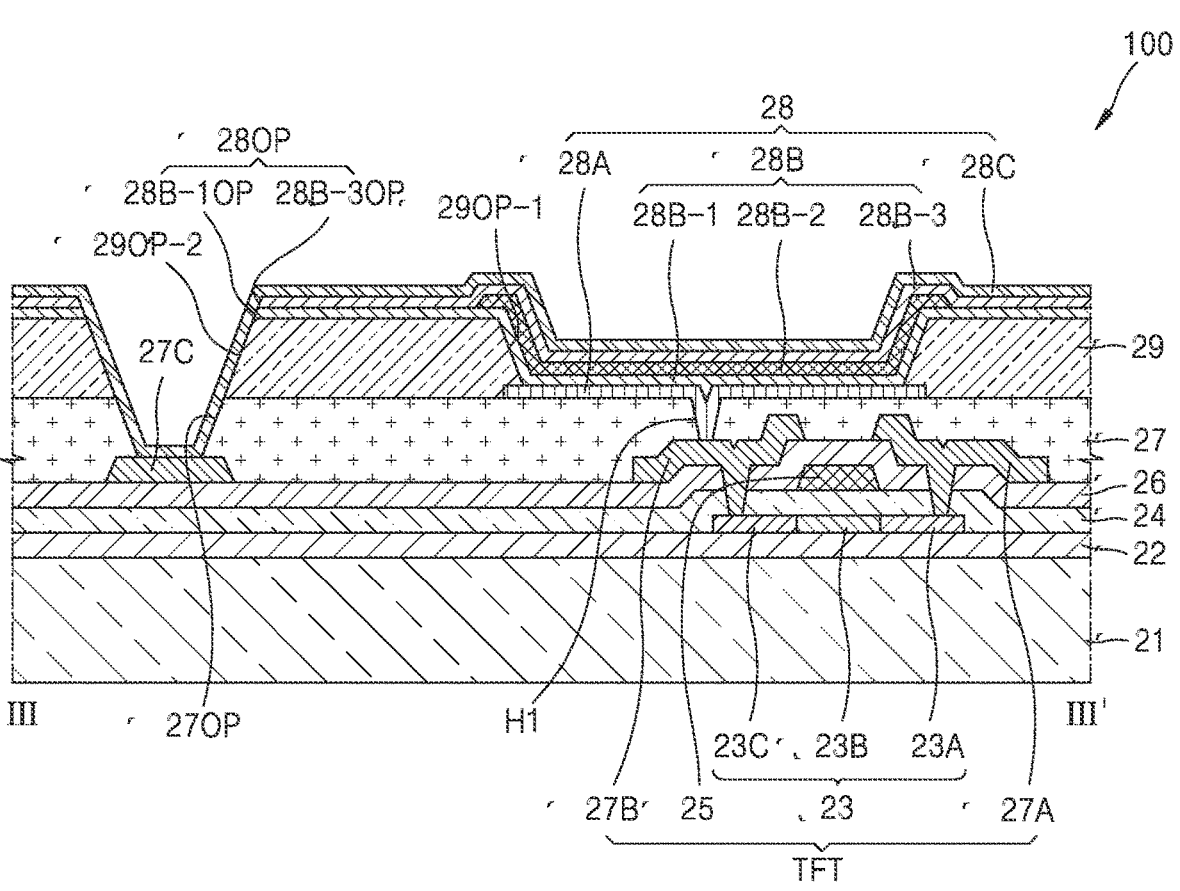
FIG. 15 is a cross-sectional view of the display apparatus taken along the line III-III' of FIG. 14.

FIG. 14 is a schematic plan view of a portion of a display apparatus according to another embodiment. FIG. 15 is a cross-sectional view of a display apparatus taken along the line III-III' of FIG. 14. Referring to FIGS. 14 and 15, except for features regarding the auxiliary electrodes 27C, the other features therein are the same or substantially the same as those described above with reference to FIGS. 3 to 6, and thus, redundant description thereof may not be repeated, and the differences therebetween may be mainly described hereinafter.

Referring to FIG. 14, the auxiliary electrodes 27C may be arranged at (e.g., in or on) the display area DA. The auxiliary electrodes 27C are arranged at (e.g., in or on) a non-display area of the display area DA, where the first sub-pixels P1 to the third sub-pixels P3 are not arranged. The auxiliary electrodes 27C may each be a line configured to apply the common power voltage ELVSS (e.g., see FIG. 2).

The auxiliary electrodes 27C may extend to cross a non-display area between the second sub-pixel P2 and the first sub-pixel P1, and a non-display area between the second sub-pixel P2 and the third sub-pixel P3. As shown in FIG. 14, the auxiliary electrodes 27C may be arranged in a zigzag pattern on a plane (e.g., in a plan view), but the present disclosure is not limited thereto. The auxiliary electrodes 27C may be arranged in a diagonal pattern or a mesh pattern on a plane (e.g., in a plan view).

In the display apparatus 100, the auxiliary electrode 27C may include the same material as that of the source electrode 27A and the drain electrode 27B of the thin-film transistor TFT. In other words, the auxiliary electrodes 27C may be disposed on the interlayer insulating layer 26, and formed through the same process as that of the source electrode 27A and the drain electrode 27B. The auxiliary electrodes 27C may include the same material as that of the source electrode 27A and the drain electrode 27B, but may be arranged to be spaced apart therefrom.

Referring to FIG. 15, the auxiliary electrodes 27C may contact the opposite electrode 28C. Because some of the auxiliary electrodes 27C may be exposed, so that the auxiliary electrodes 27C contact the opposite electrode 28C, a layer between the auxiliary electrodes 27C and the opposite electrode 28C may include an opening. In other words, the passivation layer 27 may include a first passivation layer opening 27OP overlapping with a central portion of the auxiliary electrode 27C, and the bank layer 29 may include a second bank opening 29OP-2 overlapping with the central portion of the auxiliary electrode 27C. The intermediate layer 28B may include the first opening 28OP overlapping with the central portion of the auxiliary electrode 27C, and in more detail, the first opening 28OP may include the first auxiliary layer open portion 28B-1OP of the first auxiliary layer 28B-1 and the second auxiliary layer open portion 28B-3OP of the second auxiliary layer 28B-3. Thus, the first passivation layer opening 27OP, the second bank opening 29OP-2, the first auxiliary layer open portion 28B-1OP, and the second auxiliary layer open portion 28B-2OP may overlap with each other, and the auxiliary electrodes 27C may be exposed to the outside in an area where the first passivation layer opening 27OP, the second bank opening 29OP-2, the first auxiliary layer open portion 28B-1OP, and the second auxiliary layer open portion 28B-2OP overlap with each other.

In the display apparatus 100, as the auxiliary electrodes 27C contact the opposite electrode 28C in a space between the sub-pixels arranged in the RGBG structure (e.g., the PENTILE® structure), the IR drop of the opposite electrode 28C may be effectively prevented or reduced. Also, as the auxiliary electrodes 27C are formed to include the same material through the same process as those of the source electrode 27A and the drain electrode 27B instead of forming the auxiliary electrodes 27C of the same material at (e.g., in or on) the same layer as those of the pixel electrodes 28A, a space margin with the sub-pixels may be sufficiently secured. In more detail, when the auxiliary electrode 27C is formed of the same material at (e.g., in or on) the same layer as those of the pixel electrode 28A of each sub-pixel, because the auxiliary electrode 27C may be arranged while maintaining or substantially maintaining a suitable distance (e.g., a predetermined or certain distance) from the pixel electrode 28A, there may be a design limitation, such as an increase in a width of the auxiliary electrode 27C. However, as in the display apparatus 100 according to the present embodiment, when the auxiliary electrode 27C is formed of the same material at (e.g., in or on) the same layer as those of the source electrode 27A and the drain electrode 27B, the space may be easily utilized because of a greater distance between the auxiliary electrode 27C and the source electrode 27A and the drain electrode 27B, and thus, the auxiliary electrode 27C may be more freely designed. In more detail, when a width of the auxiliary electrode 27C is great, an area where the first opening 28OP may be formed is great, and thus, the process margin may be sufficiently secured in a process such as a laser drilling process of forming the first opening 28OP arranged in the auxiliary electrode 27C.

Figure 16:
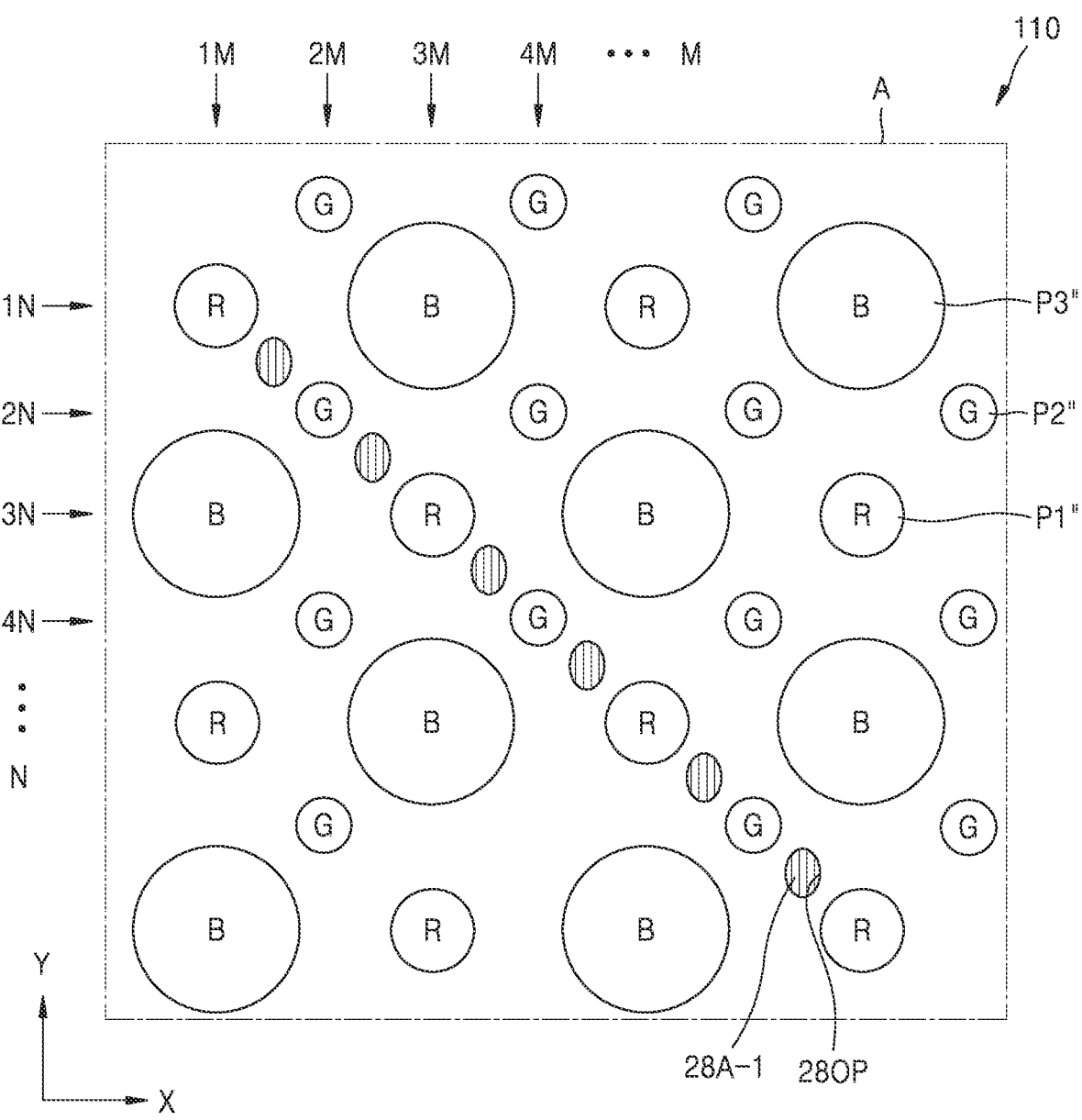
FIG. 16 is a schematic plan view of a portion of a display apparatus according to another embodiment.

FIG. 16 is a schematic plan view of a portion of a display apparatus according to another embodiment. Referring to FIG. 16, except for features regarding first sub-pixels P1", second sub-pixels P2", third sub-pixels P3", and the first openings 28OP, the other features therein are the same or substantially the same as those described above with reference to FIGS. 3 to 6, and thus, redundant description thereof may not be repeated, and the difference therebetween may be mainly described in more detail hereinafter.

Referring to FIG. 16, the sub-pixels arranged at (e.g., in or on) the display area DA may be arranged in a circular diamond structure. The first sub-pixel P1", the second sub-pixel P2", and the third sub-pixel P3" may realize a red color, a green color, and a blue color, respectively.

Like the RGBG structure (e.g., the PENTILE® structure), in an arrangement structure of the sub-pixels, the first sub-pixels P1" and the third sub-pixels P3" are alternately arranged along a first row 1N, the second sub-pixels P2" are arranged at suitable intervals (e.g., predetermined or certain intervals) along a second row 2N adjacent to the first row 1N, the third sub-pixels P3" and the first sub-pixels P1" are alternately arranged along a third row 3N adjacent to the second row 2N, the second sub-pixels P2" are arranged at suitable intervals (e.g., predetermined or certain intervals) along a fourth row 4N adjacent to the third row 3N, and the above-described sub-pixel arrangement is repeated to an $N^{th}$ row, where N is a natural number.

The first sub-pixels P1" and the third sub-pixels P3" arranged in the first row 1N and the second sub-pixels P2" arranged in the second row 2N are alternately arranged. Therefore, the first sub-pixels P1" and the third sub-pixels P3" are alternately arranged along a first column 1M, the second sub-pixels P2" are arranged at suitable intervals (e.g., predetermined or certain intervals) along a second column 2M adjacent to the first column 1M, the third sub-pixels P3" and the first sub-pixels P1" are alternately arranged along a third column 3M adjacent to the second column 2M, the second sub-pixels P2" are arranged at suitable intervals (e.g., predetermined or certain intervals) along a fourth column 4M adjacent to the third column 3M, and the above-described sub-pixel arrangement is repeated to an $M^{th}$ column, where M is a natural number.

The first sub-pixels P1", the second sub-pixels P2", and the third sub-pixels P3" may be arranged in a circle. In other words, open portions of the first sub-pixel P1", the second sub-pixel P2", and the third sub-pixel P3" may each be circular. In this case, a size of the third sub-pixel P3" may be greater than sizes of the first sub-pixel P1" and the second sub-pixel P2". Accordingly, a distance between the first sub-pixel P1" and the second sub-pixel P2" may be greater than a distance between other sub-pixels. The above structure is referred to as an RGBG matrix structure (e.g., a PENTILE® matrix structure) or a circular diamond structure, and by performing rendering during which adjacent sub-pixels are shared to express colors, a high resolution may be realized with a smaller number of pixels.

Also, the auxiliary electrodes 28A-1 may be arranged at (e.g., in or on) the display area DA. The auxiliary electrodes 28A-1 are arranged at (e.g., in or on) the non-display area of the display area DA, where the first sub-pixels P1" to the third sub-pixels P3" are not arranged. The auxiliary electrodes 28A-1 may extend to cross the non-display area between the second sub-pixel P2" and the first sub-pixel P1", and the non-display area between the second sub-pixel P2" and the third sub-pixel P3". The auxiliary electrodes 28A-1 may be arranged at (e.g., in or on) the non-display area in a zigzag pattern, a diagonal pattern, or a mesh pattern on a plane (e.g., in a plan view).

Because the auxiliary electrodes 28A-1 contact the opposite electrode 28C (e.g., see FIG. 4), the upper layers of the auxiliary electrodes 28A-1 may include the first openings 28OP exposing portions of the auxiliary electrodes 28A-1. The first openings 28OP may overlap with the pattern in which the auxiliary electrodes 28A-1 are arranged. The first openings 28OP may be arranged in a straight or substantially straight line on a plane (e.g., in a plan view) along the pattern in which the auxiliary electrodes 28A-1 are arranged. As another example, the first openings 28OP may be formed along the pattern in which the auxiliary electrodes 28A-1 are arranged, and may be formed as holes drilled into some portions of the pattern in which the auxiliary electrodes 28A-1 are arranged. In more detail, when the sub-pixels are arranged in a circular diamond structure, a distance between the first sub-pixel P1" and the second sub-pixel P2" is great, and thus, the first opening 28OP may be arranged at (e.g., in or on) the non-display area between the first sub-pixel P1" and the second sub-pixel P2".

In the display apparatus 110 according to the present embodiment, as the sub-pixels are arranged in a circle, and the first openings 28OP are arranged at (e.g., in or on) the non-display area between the first sub-pixel P1" and the second sub-pixel P2", a non-display area where the auxiliary electrodes 28A-1 and the first openings 28OP may be arranged may be sufficiently secured, and the IR drop in the opposite electrode 28C may be effectively reduced.

Figure 17:
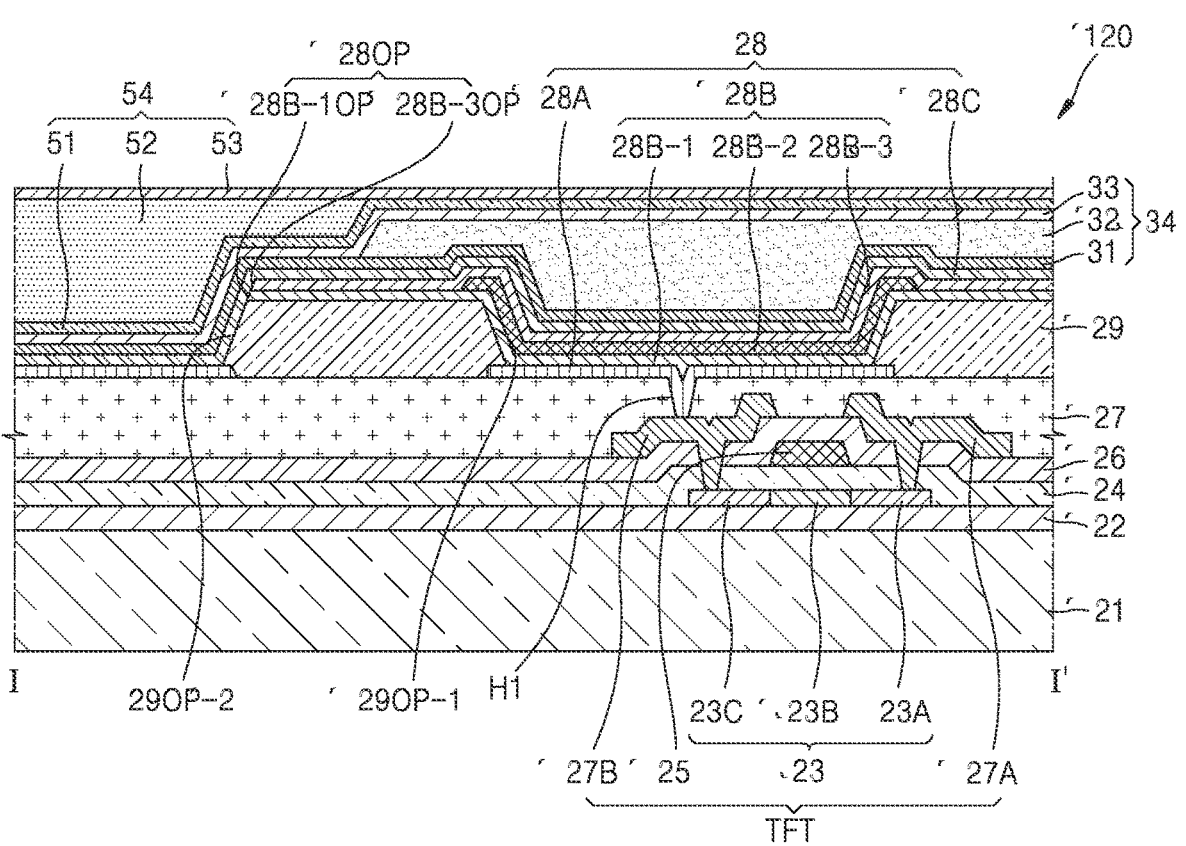
FIG. 17 is a schematic cross-sectional view of a portion of a display apparatus according to another embodiment.

FIG. 17 is a schematic cross-sectional view of a portion of a display apparatus according to another embodiment. For example, FIG. 17 may correspond to a cross-sectional view taken along the line I-I' of FIG. 3. Referring to FIG. 17, except for features regarding an encapsulation layer 34 and a planar portion 54, the other features therein are the same or substantially the same as those described above with reference to FIGS. 3 to 6, and thus, redundant description thereof may not be repeated, and the differences therebetween may be mainly described in more detail hereinafter.

The encapsulation layer 34 may be disposed on the opposite electrode 28C. The encapsulation layer 34 may include at least one inorganic encapsulation layer, and at least one organic encapsulation layer. In an embodiment, as shown in FIG. 17, the encapsulation layer 34 includes a first inorganic encapsulation layer 31, a second inorganic encapsulation layer 33, and a first organic encapsulation layer 32 arranged between the first inorganic encapsulation layer 31 and the second inorganic encapsulation layer 33.

The first inorganic encapsulation layer 31 and the second inorganic encapsulation layer 33 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride.

The first organic encapsulation layer 32 may include a polymer-based material. The polymer-based material may include an acrylic resin, an epoxy-based resin, polyimide, polyethylene, and/or the like. For example, the first organic encapsulation layer 32 may include an acrylic resin, for example, such as polymethyl methacrylate, polyacrylic acid, and/or the like. The first organic encapsulation layer 32 may be formed by curing a monomer or applying a polymer.

In some embodiments, an input detector may be further arranged on the encapsulation layer 34. The input detector may include a plurality of conductive layers including a plurality of detection sensors capable of detecting external input signals, and a plurality of detection insulating layers.

The planar portion 54 may be further arranged on the encapsulation layer 34. The planar portion 54 may include a first planar inorganic layer 51, a first planar organic layer 52, and a second planar inorganic layer 53. The planar portion 54 may include at least one of the first planar inorganic layer 51 or the second planar inorganic layer 53. The first planar organic layer 52 may include an organic material, and may be formed through a solution process such as spin coating, slit coating, or an inkjet process.

The planar portion 54 may be arranged between a display layer and the input detector. In other words, the planar portion 54 may be arranged in some regions between the input detector and the encapsulation layer 34 covering the display elements. The first planar organic layer 52 covers a portion of the display layer. In an embodiment, the first planar organic layer 52 may be arranged in an area where the first opening 28OP is arranged. The first planar organic layer 52 may be arranged to fill gaps between openings in the upper layers of the auxiliary electrodes 28A-1, and may compensate for a step difference between the display layer and the input detector. In this case, the openings expose some portions of the auxiliary electrodes 28A-1. In more detail, the bank layer 29 arranged on the upper portion of the auxiliary electrode 28A-1 to expose some portions of the auxiliary electrode 28A-1 includes the second bank opening 29OP-2 to overlap with the central portion of the auxiliary electrode 28A-1, and the intermediate layer 28B includes the first opening 28OP. Thus, the first planar organic layer 52 may fill the second bank opening 29OP-2 and the first opening 28OP. Accordingly, the first planar organic layer 52 may cover a non-planar surface defined in the second bank opening 29OP-2 and the first opening 28OP, and may flatten or substantially flatten the upper portion of the display apparatus 120. As a result, in the display apparatus 120 according to the present embodiment, a planar surface may be stably provided, even in an area where some portions of the auxiliary electrode 28A-1 are exposed to the outside, or in other words, an organic layer such as the bank layer 29 is not arranged, and thus, high-quality images may be produced.

FIGS. 18A through 18F are cross-sectional diagrams showing a sequence of processes of manufacturing a display apparatus, according to an embodiment.

Figure 18A:
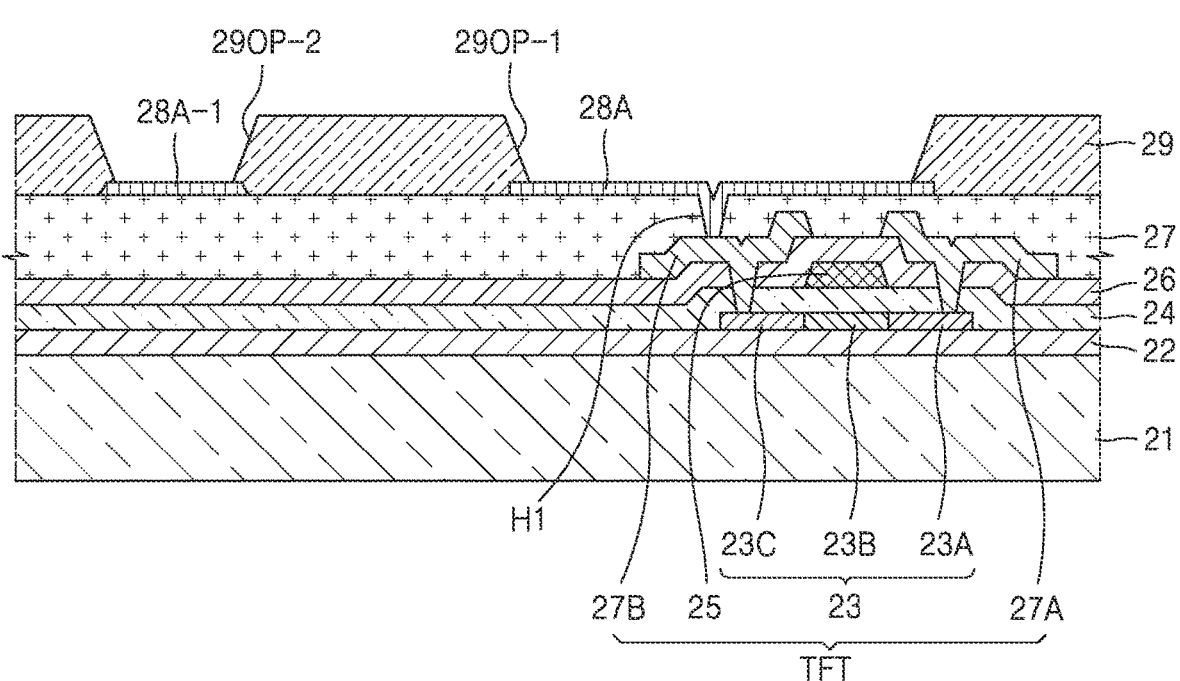
FIGS. 18A-18F are cross-sectional diagrams showing a sequence of processes of manufacturing a display apparatus, according to an embodiment.

As shown in FIG. 18A, after the thin-film transistor TFT is formed on the substrate 21, the passivation layer 27 is arranged to cover the thin-film transistor TFT. The pixel electrode 28A and the auxiliary electrode 28A-1 may be formed on the passivation layer 27. The pixel electrode 28A and the auxiliary electrode 28A-1 may be formed at (e.g., in or on) the same layer as each other, so that the pixel electrode 28A and the auxiliary electrode 28A-1 may be spaced apart from each other and electrically insulated from each other. As the pixel electrode 28A and the auxiliary electrode 28A-1 are concurrently (e.g., simultaneously or substantially simultaneously) formed with each other, the pixel electrode 28A may include the same material as that of the auxiliary electrode 28A-1.

Then, the bank layer 29 may be formed to expose at least a portion of the pixel electrode 28A. In other words, the bank layer 29 may include the first bank opening 29OP-1 exposing a portion of the pixel electrode 28A. For example, the bank layer 28 may cover the edges of the pixel electrode 28A. The bank layer 29 may define the pixels by including an opening corresponding to each sub-pixel, or in other words, an opening exposing at least a portion of the pixel electrode 28A. The bank layer 29 may increase a distance between an end portion of the pixel electrode 28A and an opposite electrode to be formed in a subsequent process, and thus, may prevent or substantially prevent arcs and the like from being generated on the end portions of the pixel electrode 28A.

As shown in FIG. 18A, when the pixel electrode 28A is formed at (e.g., in or on) the same layer as that of the auxiliary electrode 28A-1, the bank layer 29 may be formed to expose at least a portion of the auxiliary electrode 28A-1 as well. In other words, the bank layer 29 may include the second bank opening 29OP-2 exposing a portion of the auxiliary electrode 28A-1. For example, the bank layer 28 may cover the edges of the auxiliary electrode 28A-1.

Figure 18B:
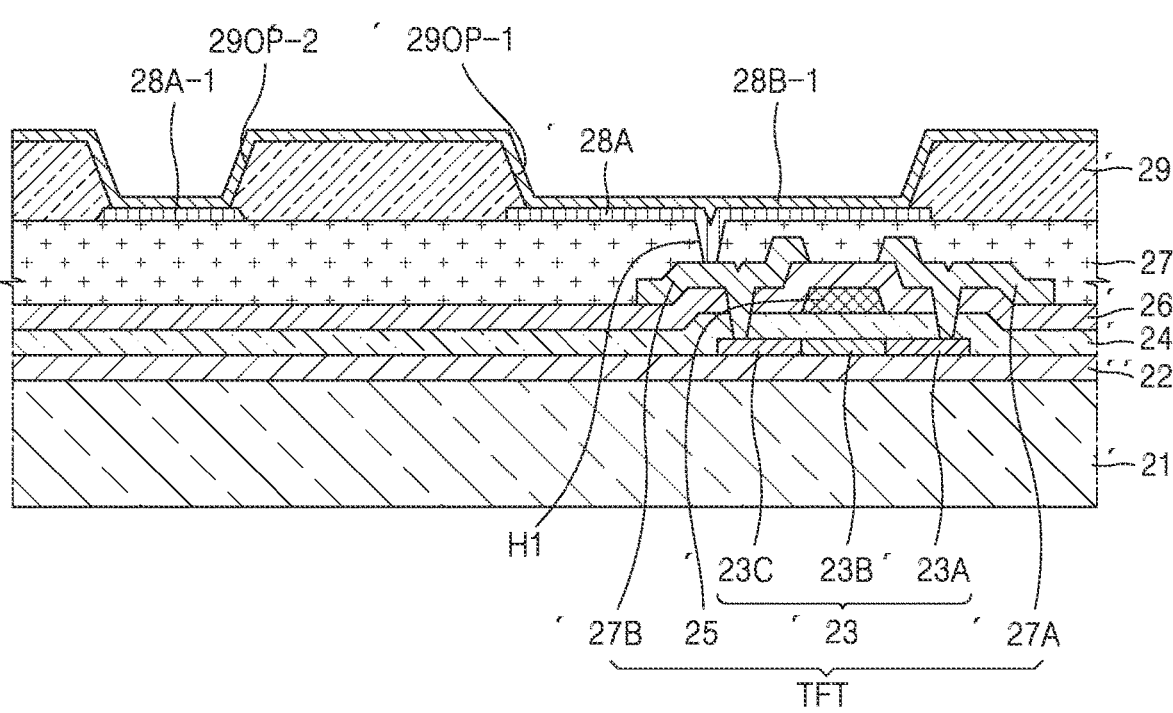

Referring to FIG. 18B, the first auxiliary layer 28B-1 may be formed on the bank layer 29. In an embodiment, as described above, the first auxiliary layer 28B-1 may be entirely formed at (e.g., in or on) the display area DA. In this case, the first auxiliary layer 28B-1 may be formed on the bank layer 29, the exposed pixel electrode 28A, and the exposed auxiliary electrode 28A-1.

In another embodiment, the first auxiliary layer 28B-1 may be formed in only an open portion of the bank layer 29. When the first auxiliary layers 28B-1 are formed in only the open portion of the bank layer 29, the first auxiliary layers 28B-1 may be formed to be spaced apart from each other.

Hereinafter, for convenience, a case where the first auxiliary layer 28B-1 is entirely formed at (e.g., in or on) the display area DA is described in more detail.

Figure 18C:
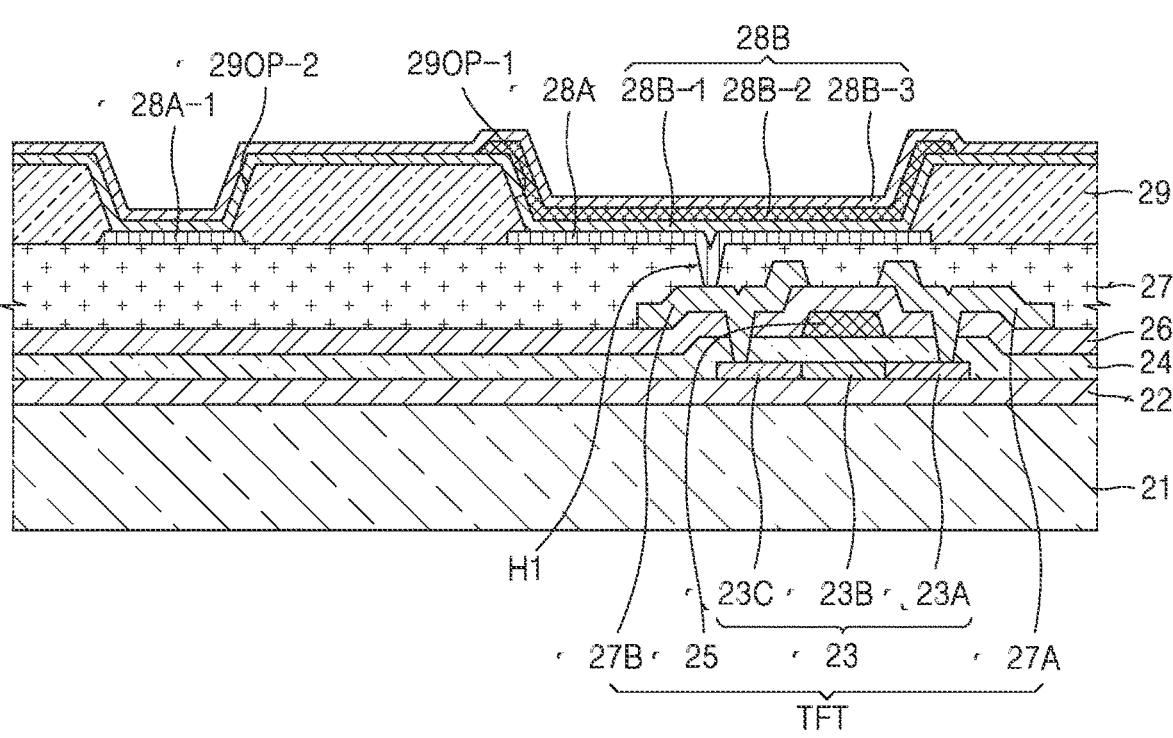

Referring to FIG. 18C, the organic emission layers 28B-2 may be formed on the first auxiliary layer 28B-1. The organic emission layers 28B-2 may be formed in only the open portion of the bank layer 29. In this case, the organic emission layers 28B-2 may be arranged to be spaced apart from each other, and may form a suitable pattern (e.g., a predetermined or certain pattern) at (e.g., in or on) the display area DA. Also, the organic emission layers 28B-2 may be arranged, so that different materials may correspond to the open portions of the bank layer 29 according to the colors of emitted light.

In another embodiment, the organic emission layer 28B-2 may cover the entire display area DA. In this case, the organic emission layer 28B-2 may have a structure in which suitable materials for emitting different colors of light are stacked. In this case, a plurality of pixels may emit the same or substantially the same color of light, and the color of light emitted from each pixel may be white. Also, the organic emission layer 28B-2 may be arranged on the exposed pixel electrode 28A, as well as on the exposed auxiliary electrode 28A-1.

Hereinafter, for convenience, the organic emission layers 28B-2 that are arranged only in the open portion of the bank layer 29, and that are spaced apart from each other at (e.g., in or on) the display area DA may be described in more detail.

Also, the second auxiliary layer 28B-3 may be formed on the first auxiliary layer 28B-1 and the organic emission layer 28B-2. In this case, the second auxiliary layer 28B-3 may entirely cover the display area DA. In this case, the second auxiliary layer 28B-3 may cover the bank layer 29, the exposed pixel electrode 28A, and the exposed auxiliary electrode 28A-1.

Figure 18D:
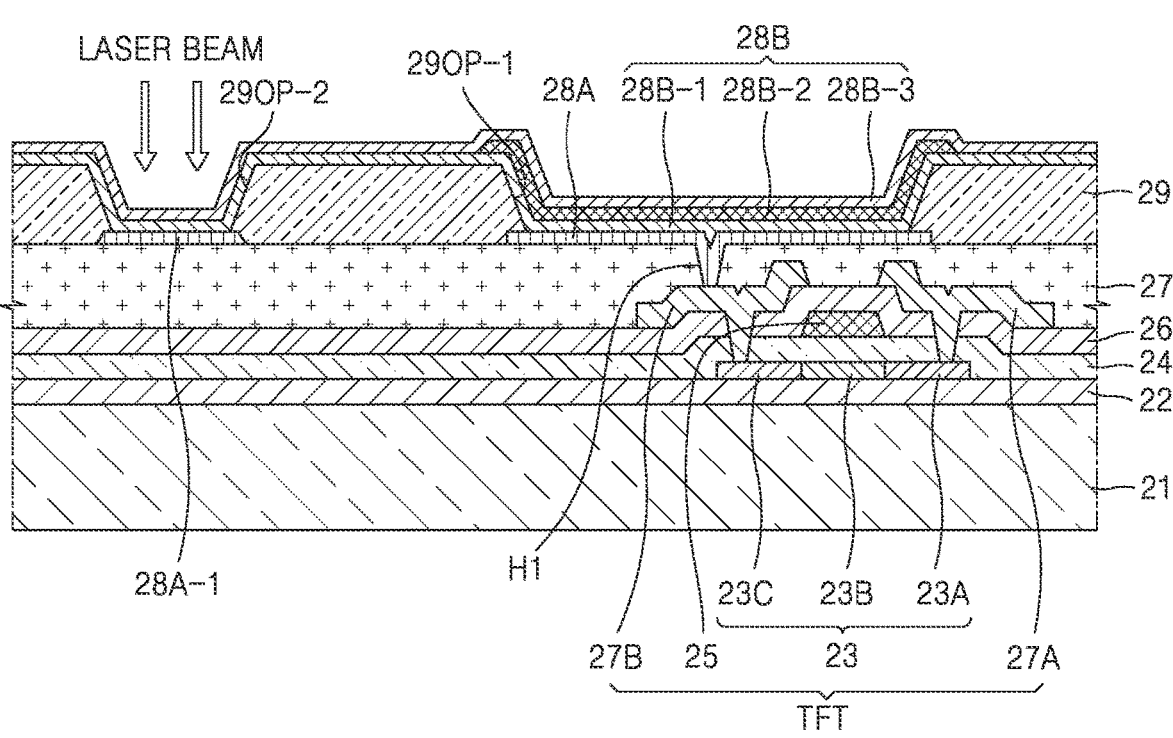
Figure 18E:
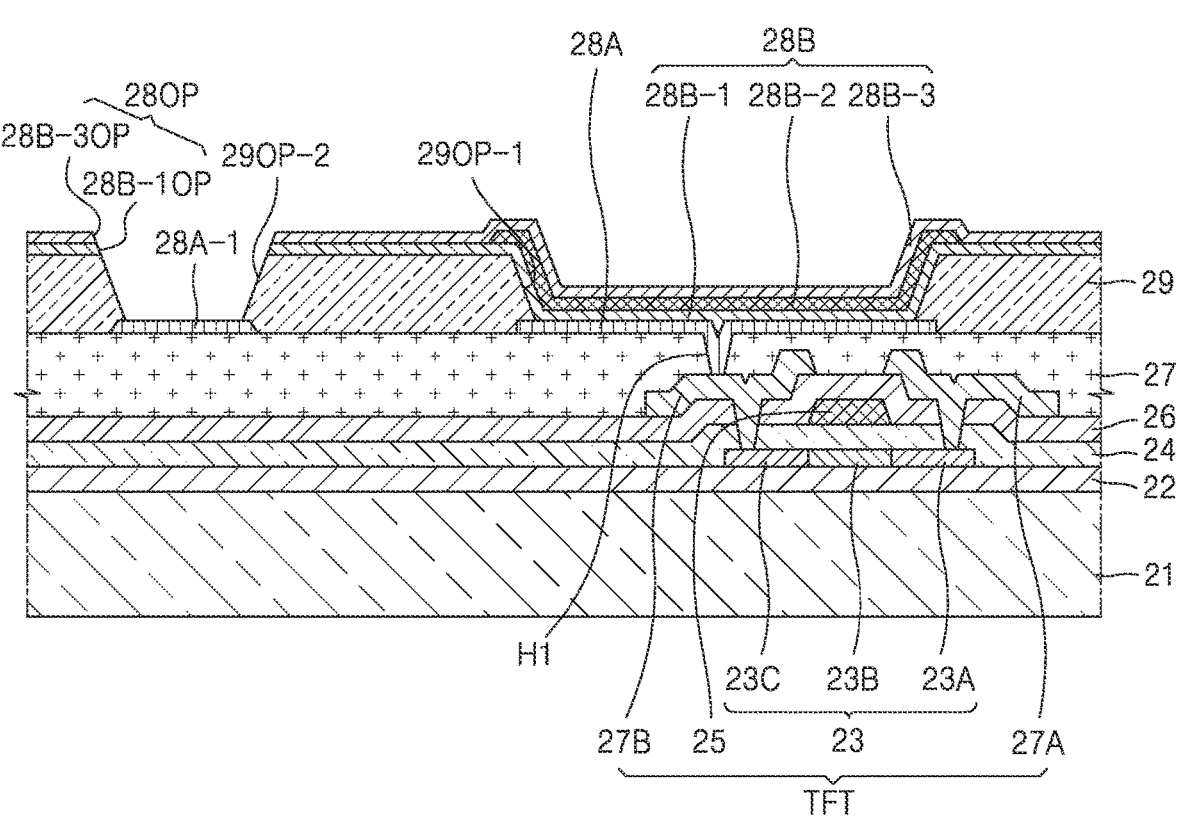

Referring to FIGS. 18D and 18E, after the intermediate layer 28B is formed to include the second auxiliary layer 28B-3, laser beams may be irradiated onto the second auxiliary layer 28B-3. As shown in FIG. 18E, the irradiation of the laser beams may be used to form the first auxiliary layer open portion 28B-1OP and the second auxiliary layer open portion 28B-3OP of the first auxiliary layer 28B-1 by removing a portion of the first auxiliary layer 28B-1 and a portion of the second auxiliary layer 28B-3 that are on the auxiliary electrode 28A-1. In other words, by irradiating the laser beams onto the intermediate layer 28B, the first openings 28OP may be formed in the intermediate layer 28B to expose at least some portions of the auxiliary electrode 28A-1. In this case, the first auxiliary layer open portion 28B-1OP of the first auxiliary layer 28B-1 and the second auxiliary layer open portion 28B-3OP may be concurrently (e.g., simultaneously or substantially simultaneously) formed with each other.

Figure 18F:
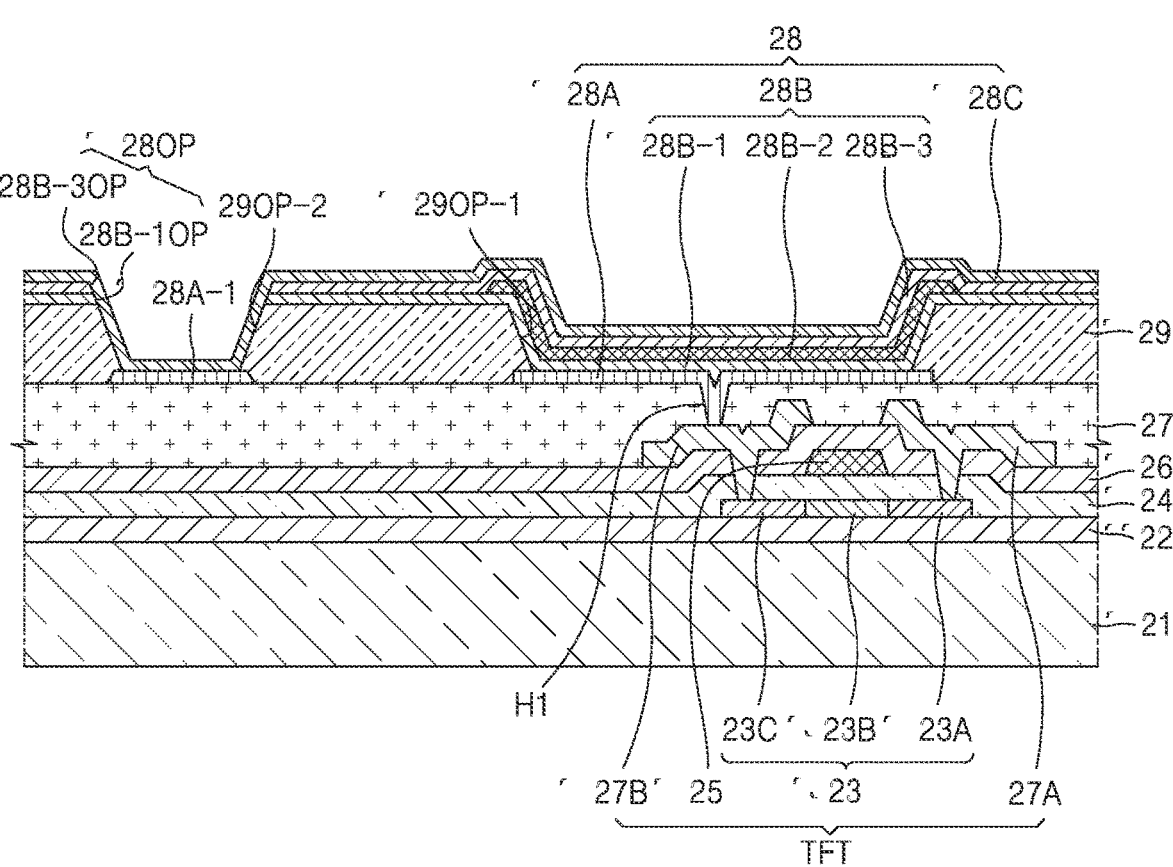

Then, referring to FIG. 18F, the opposite electrode 28C corresponding to the pixel electrode 28A and the auxiliary electrode 28A-1 may be formed, such that the opposite electrode 28C contacts the auxiliary electrode 28A-1 through the first auxiliary layer open portion 28B-1OP of the first auxiliary layer 28B-1 and the second auxiliary layer open portion 28B-3OP of the second auxiliary layer 28B-3. The opposite electrode 28C may be integrally formed over the sub-pixels, and may cover the display area DA. As the opposite electrode 28C contacts the auxiliary electrode 28A-1 through the first opening 28OP, the IR drop in the opposite electrode 28C may be prevented or reduced.

FIGS. 19A through 19F are cross-sectional diagrams showing a sequence of processes of manufacturing a display apparatus, according to another embodiment. Referring to FIGS. 19A to 19F, except for features regarding the second bank opening 29OP-2 and the first opening 28OP, the other features therein are the same or substantially the same as those described above with reference to FIGS. 18A to 18F, and thus, redundant description thereof may not be repeated, and the differences therebetween may be mainly described in more detail hereinafter.

Figure 19A:
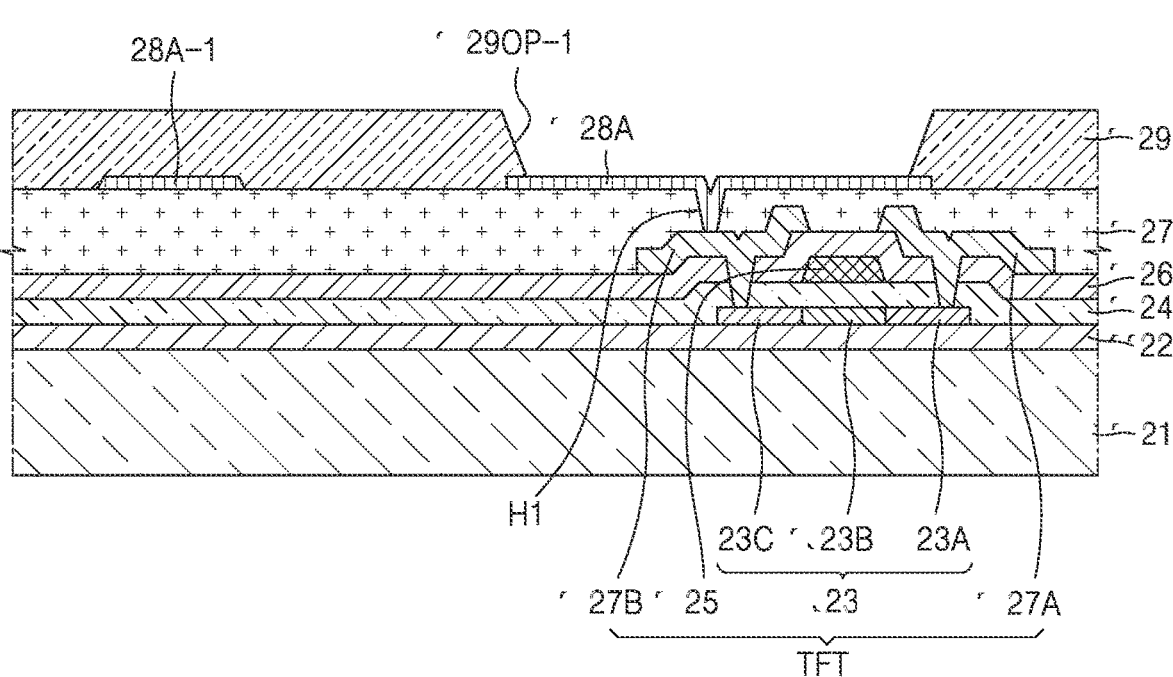
FIGS. 19A-19F are cross-sectional diagrams showing a sequence of processes of manufacturing a display apparatus, according to another embodiment.

Referring to FIG. 19A, as described above with reference to FIG. 18A, the pixel electrode 28A and the auxiliary electrode 28A-1, which include the same material as each other, may be formed to be spaced apart from each other on the passivation layer 27. Then, the bank layer 29 may be formed to expose at least a portion of the pixel electrode 28A. In other words, the bank layer 29 may include the first bank opening 29OP-1 exposing a portion of the pixel electrode 28A.

The bank layer 29 may be formed to not expose the auxiliary electrode 28A-1. In other words, the bank layer 29 may not include the second bank opening 29OP-2 (e.g., see FIG. 18A) that exposes a portion of the auxiliary electrode 28A-1. The bank layer 29 may be planar without an opening or the like at (e.g., in or on) the non-display area on the auxiliary electrode 28A-1.

Figure 19B:
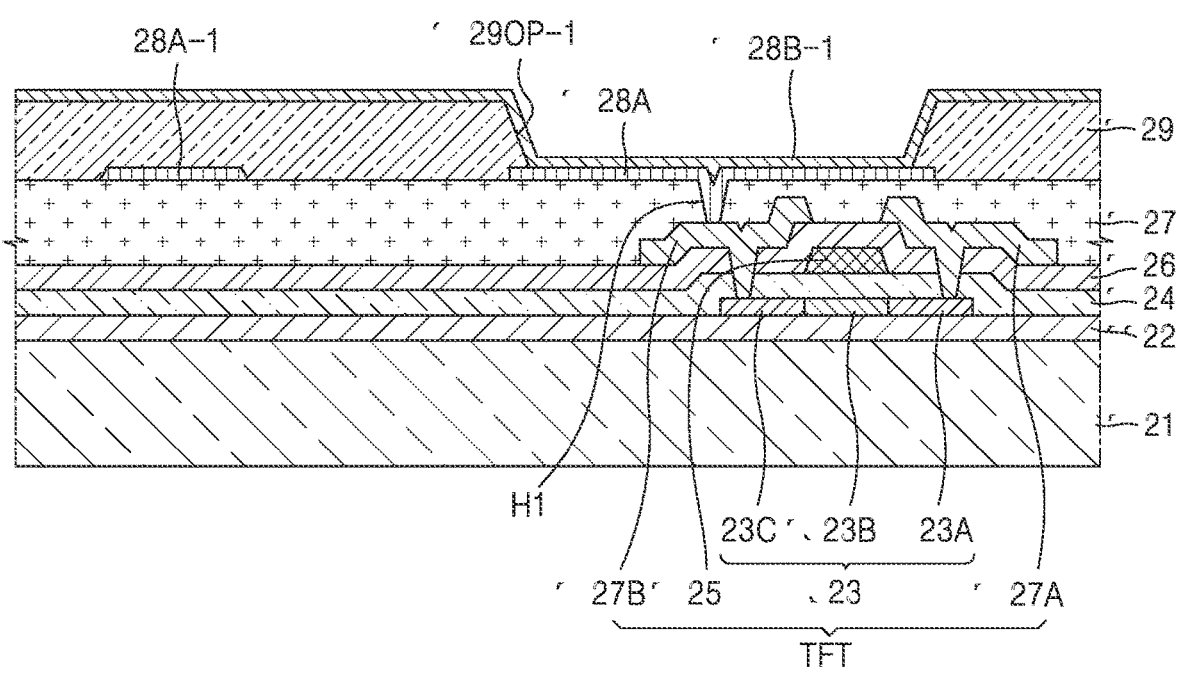
Figure 19C:
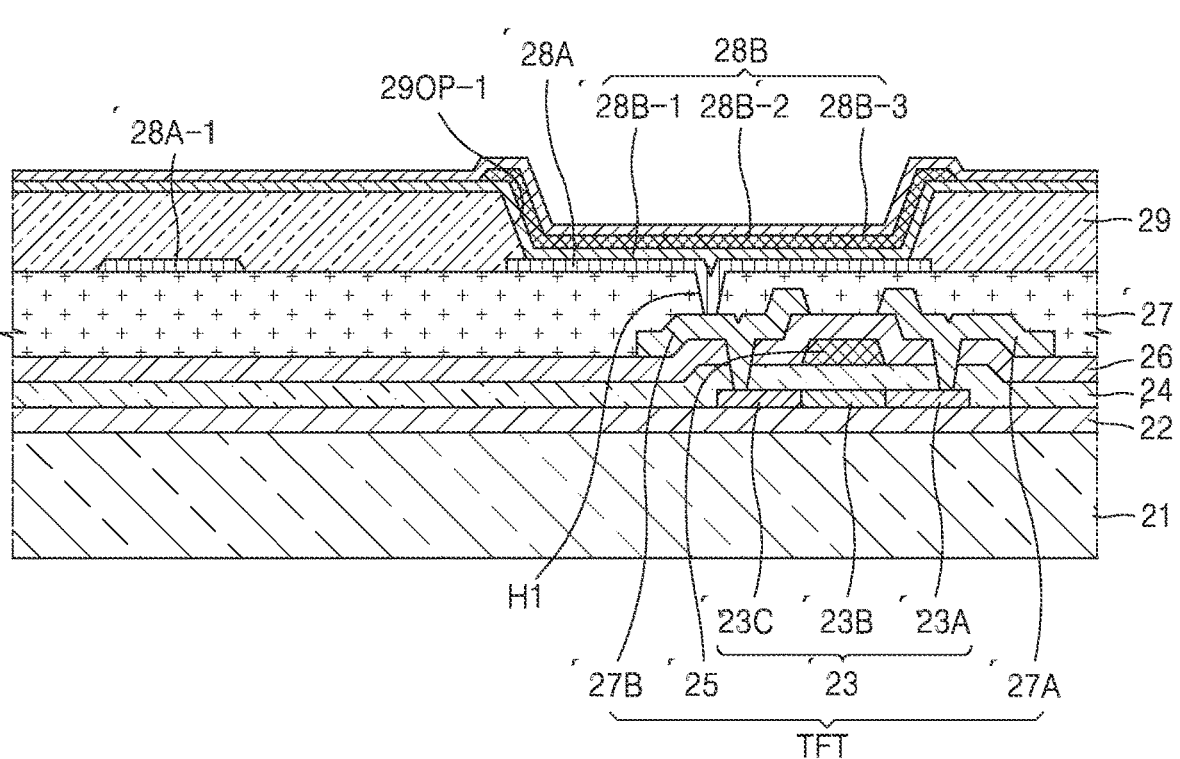

Then, referring to FIGS. 19B and 19C, the first auxiliary layer 28B-1, the organic emission layer 28B-2, and the second auxiliary layer 28B-3 may be sequentially stacked on the bank layer 29. In an embodiment, the first auxiliary layer 28B-1 and the second auxiliary layer 28B-3 may be integrally formed at (e.g., in or on) the entire display area DA, and the organic emission layer 28B-2 may be formed in the open portion of the bank layer 29.

Figure 19D:
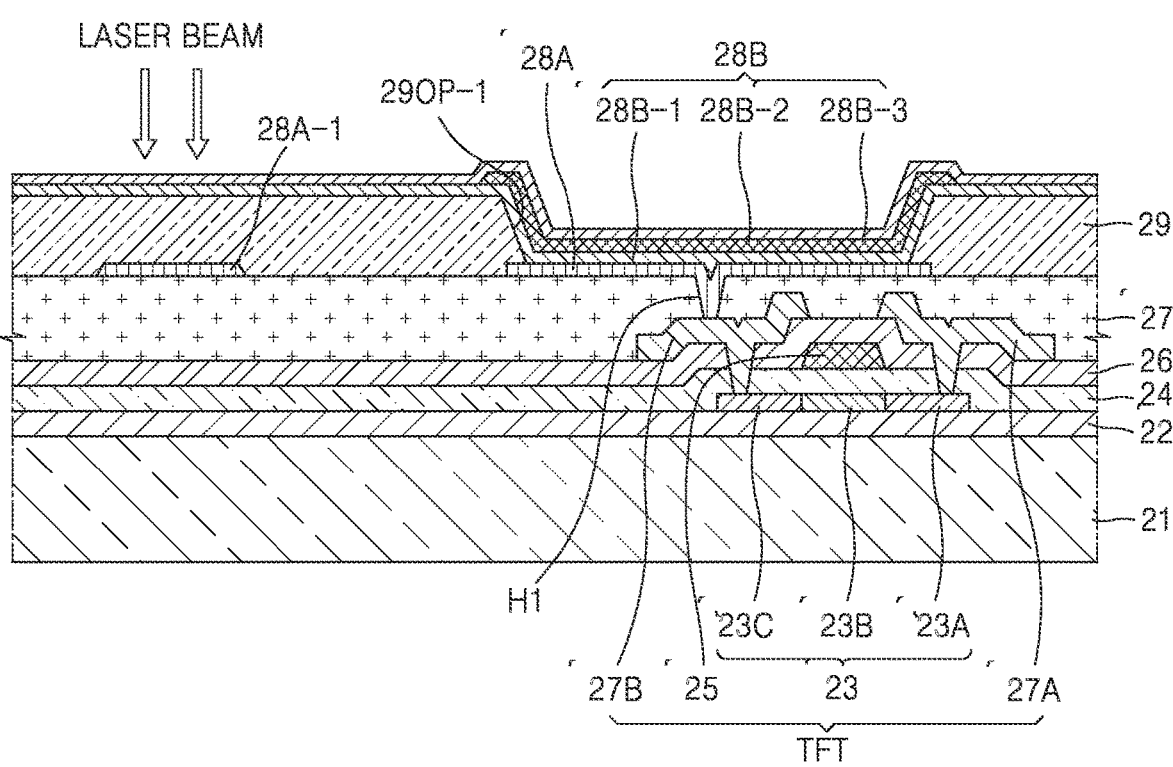
Figure 19E:
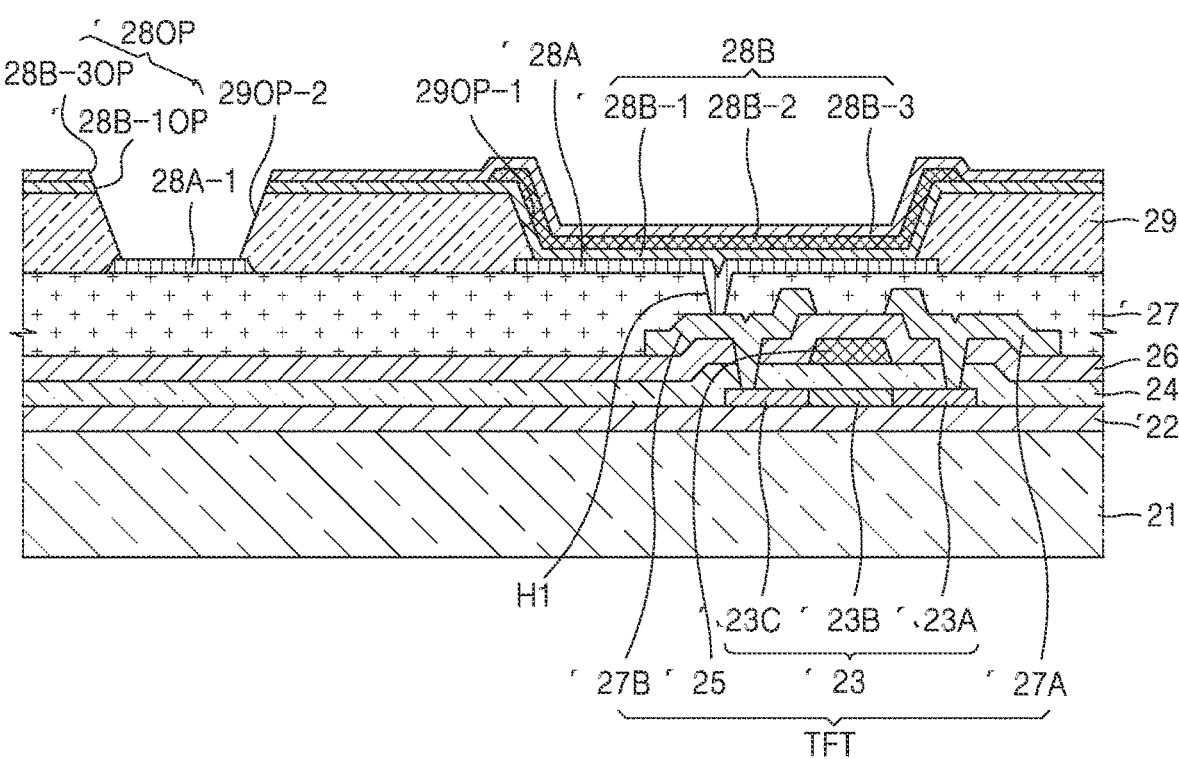

Referring to FIGS. 19D and 19E, after the intermediate layer 28B is formed to include the second auxiliary layer 28B-3, laser beams may be irradiated onto the second auxiliary layer 28B-3. As shown in FIG. 19E, the irradiation of the laser beams is to form the first auxiliary layer open portion 28B-1OP of the first auxiliary layer 28B-1, the second auxiliary layer open portion 28B-3OP, and the second bank opening 29OP-2 of the bank layer 29, by removing a portion of the first auxiliary layer 28B-1, a portion of the second auxiliary electrode 28B-3, and a portion of the bank layer 29, the portions being on the auxiliary electrode 28A-1. In other words, by irradiating laser beams onto the intermediate layer 28B and the bank layer 29, the first opening 28OP may be formed in the intermediate layer 28B, and the second bank opening 29OP-2 may be formed in the bank layer 29, and thus, a portion of the auxiliary electrode 28A-1 may be exposed. In this case, the first auxiliary layer open portion 28B-1OP of the first auxiliary layer 28B-1, the second auxiliary layer open portion 28B-3OP of the second auxiliary layer 28B-3, and the second bank opening 29OP-2 of the bank layer 29 may be concurrently (e.g., simultaneously or substantially simultaneously) formed with each other.

Figure 19F:
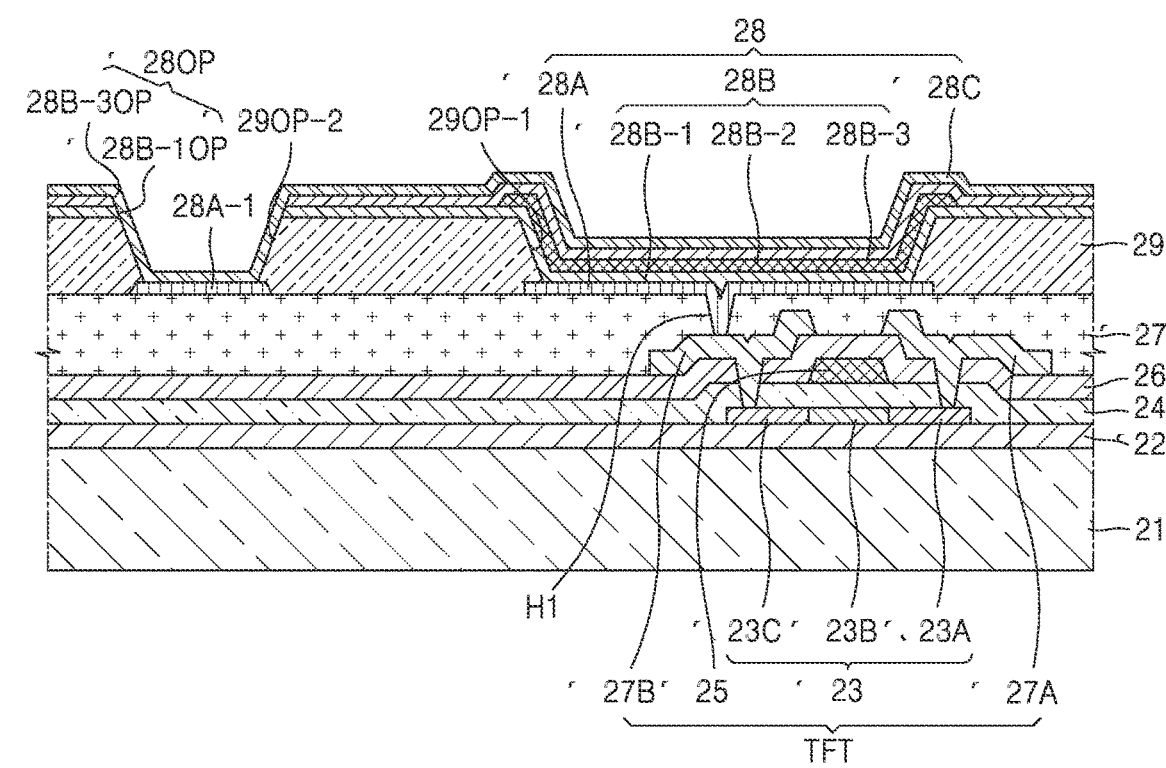

Then, referring to FIG. 19F, the opposite electrode 28C corresponding to the pixel electrode 28A and the auxiliary electrode 28A-1 may be formed, such that the opposite electrode 28C contacts the first auxiliary layer open portion 28B-1OP of the first auxiliary layer 28B-1, the second auxiliary layer open portion 28B-3OP of the second auxiliary layer 28B-3, and the second bank opening 29OP-2 of the bank layer 29. The opposite electrode 28C may be integrally formed over the sub-pixels, and may cover the display area DA. As the opposite electrode 28C contacts the auxiliary electrode 28A-1 through the first opening 28OP and the second bank opening 29OP-2, the IR drop in the opposite electrode 28C may be prevented or reduced.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a substrate comprising:
      a plurality of pixel areas corresponding to a plurality of sub-pixels, respectively, the plurality of sub-pixels comprising a first sub-pixel, a second sub-pixel, and a third sub-pixel configured to emit different colors of light from each other; and
      a plurality of non-display areas surrounding the plurality of pixel areas, respectively;
   a first electrode on the substrate;
   an auxiliary electrode on the substrate, and extending to cross a non-display area from among the plurality of non-display areas between the second sub-pixel and the first sub-pixel, and a non-display area from among the plurality of non-display areas between the second sub-pixel and the third sub-pixel;
   a bank layer having a first bank opening overlapping with the first electrode, and a second bank opening overlapping with the auxiliary electrode;
   an intermediate layer on the first electrode and the auxiliary electrode, and having a first opening exposing a portion of the auxiliary electrode and overlapping with a pattern including the auxiliary electrode; and
   a second electrode on the intermediate layer to overlap with the first electrode and the auxiliary electrode, and contacting the auxiliary electrode through the first opening in the intermediate layer, wherein the second bank opening of the bank layer and the first opening of the intermediate layer overlap with each other, and each has a shape that extends along the pattern including the auxiliary electrode.

2. The display apparatus of claim 1, wherein the first sub-pixel and the third sub-pixel are alternately located along a first row in a first direction, the second sub-pixel is located along the first direction in a second row parallel to the first row, and the second sub-pixel is alternately located with each of the first sub-pixel and the third sub-pixel.

3. The display apparatus of claim 1, wherein the pattern including the auxiliary electrode extends in a first direction in a zigzag pattern in a plan view, and wherein the first opening has a straight line shape in a plan view that extends along the pattern including the auxiliary electrode.

4. The display apparatus of claim 1, wherein the pattern including the auxiliary electrode extends in a first direction in a zigzag pattern in a plan view, and wherein the first opening has a hole shape exposing a portion of the pattern including the auxiliary electrode.

5. The display apparatus of claim 1, wherein the pattern including the auxiliary electrode extends in a straight line shape in parallel with a diagonal direction in which the first sub-pixel and the second sub-pixel are alternately located in a plan view, and wherein the first opening has a straight line shape in a plan view extending along the pattern including the auxiliary electrode.

6. The display apparatus of claim 1, wherein the pattern including the auxiliary electrode extends in a straight line shape in parallel with a diagonal direction in which the first sub-pixel and the second sub-pixel are alternately located in a plan view, and wherein the first opening has a hole shape exposing a portion of the pattern including the auxiliary electrode.

7. The display apparatus of claim 5, wherein each of the plurality of sub-pixels comprises a thin-film transistor, the first electrode comprises a first connection portion extending to include a contact hole region electrically connected to the thin-film transistor, and the first connection portion extends in a direction parallel with the pattern including the auxiliary electrode.

8. The display apparatus of claim 1, wherein the pattern including the auxiliary electrode extends in a mesh pattern in a plan view.

9. The display apparatus of claim 8, wherein each of the plurality of sub-pixels comprises a thin-film transistor, the first electrode comprises a first connection portion extending to include a contact hole region electrically connected to the thin-film transistor, and the first connection portion extends in a direction towards a corner portion crossing the auxiliary electrode.

10. The display apparatus of claim 1, wherein the plurality of sub-pixels are located on vertices of a virtual quadrangle having the first opening as a center.

11. The display apparatus of claim 1, wherein the auxiliary electrode comprises a same material as that of the first electrode.

12. The display apparatus of claim 1, wherein each of the plurality of sub-pixels comprises a thin-film transistor, and wherein the auxiliary electrode comprises a same material as that of a source electrode or a drain electrode of the thin-film transistor.

13. The display apparatus of claim 2, wherein the third sub-pixel comprises a greater area than those of the first sub-pixel and the second sub-pixel, and wherein open portions of the first sub-pixel, the second sub-pixel, and the third sub-pixel are each circular in shape.

14. The display apparatus of claim 13, wherein the first opening is located in a non-display area from among the plurality of non-display areas between the first sub-pixel and the second sub-pixel.

15. The display apparatus of claim 1, further comprising:

a planar portion on the second electrode, wherein the planar portion comprises a planar inorganic layer and a planar organic layer, and wherein the planar inorganic layer and the planar organic layer overlap with the second bank opening and the first opening.

16. A method of manufacturing a display apparatus, the method comprising:

forming a first electrode on a substrate, the substrate comprising:

a plurality of pixel areas corresponding to a plurality of sub-pixels, respectively, the plurality of sub-pixels comprising a first sub-pixel, a second sub-pixel, and a third sub-pixel configured emit different colors of light from each other; and a plurality of non-display areas surrounding the plurality of pixel areas, respectively;

forming, on the substrate, an auxiliary electrode extending to cross a non-display area from among the plurality of non-display areas between the second sub-pixel and the first sub-pixel, and a non-display area from among the plurality of non-display areas between the second sub-pixel and the third sub-pixel;

forming a bank layer having a first bank opening overlapping with the first electrode, and a second bank opening overlapping with the auxiliary electrode;

forming, on the first electrode and the auxiliary electrode, an intermediate layer having a first opening exposing a portion of the auxiliary electrode and overlapping with a pattern including the auxiliary electrode; and forming a second electrode overlapping with the first electrode and the auxiliary electrode, and contacting the auxiliary electrode through the first opening in the intermediate layer, wherein the second bank opening of the bank layer and the first opening of the intermediate layer overlap with each other, and each has a shape that extends along the pattern including the auxiliary electrode.

17. The method of claim 16, wherein the intermediate layer is formed after the first bank opening and the second bank opening are formed in the bank layer.

18. The method of claim 17, wherein the first opening in the intermediate layer is formed by irradiating a laser beam onto the intermediate layer to expose a portion of the auxiliary electrode.

19. The method of claim 16, wherein, after the bank layer and the intermediate layer are consecutively deposited, the second bank opening and the first opening are concurrently formed with each other.

20. The method of claim 19, wherein the forming of the second bank opening and the first opening comprises irradiating a laser beam onto the bank layer and the intermediate layer to expose a portion of the auxiliary electrode.

* * * * *